(12) United States Patent
Motoyama et al.

(10) Patent No.: US 11,811,382 B2
(45) Date of Patent: Nov. 7, 2023

(54) LC FILTER

(71) Applicant: Murata Manufacturing Co., Ltd., Nagaokakyo (JP)

(72) Inventors: Hiroto Motoyama, Nagaokakyo (JP); Keisuke Ogawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 114 days.

(21) Appl. No.: 17/526,066

(22) Filed: Nov. 15, 2021

(65) Prior Publication Data

US 2022/0077835 A1    Mar. 10, 2022

Related U.S. Application Data

(63) Continuation of application No. PCT/JP2020/022113, filed on Jun. 4, 2020.

(30) Foreign Application Priority Data

Jul. 9, 2019    (JP) .................................. 2019-127479

(51) Int. Cl.
  *H03H 7/01*    (2006.01)
  *H03H 1/00*    (2006.01)

(52) U.S. Cl.
  CPC ........ *H03H 7/0115* (2013.01); *H03H 7/1766* (2013.01); *H03H 2001/0085* (2013.01)

(58) Field of Classification Search
  CPC ...................... H03H 2001/0085; H03H 7/0115
  USPC .................................................. 333/175, 185
  See application file for complete search history.

(56) References Cited

U.S. PATENT DOCUMENTS

| 2007/0241839 A1 | 10/2007 | Taniguchi |
| 2015/0130558 A1 | 5/2015 | Kawasaki |
| 2019/0305745 A1 | 10/2019 | Taniguchi |

FOREIGN PATENT DOCUMENTS

| EP | 2 009 787 A1 | 12/2008 |
| WO | 2007/119356 A1 | 10/2007 |
| WO | 2014/034214 A1 | 3/2014 |
| WO | 2015/059963 A1 | 4/2015 |
| WO | 2018/100923 A1 | 6/2018 |

OTHER PUBLICATIONS

Official Communication issued in International Patent Application No. PCT/JP2020/022113, dated Jul. 28, 2020.

*Primary Examiner* — Rakesh B Patel
(74) *Attorney, Agent, or Firm* — Keating & Bennett, LLP

(57) ABSTRACT

An LC filter includes a first capacitor electrode connected to one end of a first via conductor and faces a first ground electrode in a laminating direction. A second capacitor electrode is connected to one end of a second via conductor and faces the first ground electrode in the laminating direction. A third capacitor electrode is connected to one end of a third via conductor and faces the first ground electrode in the laminating direction. A fourth capacitor electrode is connected to one end of a fourth via conductor and faces the first ground electrode in the laminating direction. The second capacitor electrode faces each of the first capacitor electrode, the third capacitor electrode, and the fourth capacitor electrode in a direction orthogonal or substantially orthogonal to the laminating direction.

17 Claims, 28 Drawing Sheets

LC FILTER

CROSS REFERENCE TO RELATED APPLICATIONS

This application claims the benefit of priority to Japanese Patent Application No. 2019-127479 filed on Jul. 9, 2019 and is a Continuation Application of PCT Application No. PCT/JP2020/022113 filed on Jun. 4, 2020. The entire contents of each application are hereby incorporated herein by reference.

BACKGROUND OF THE INVENTION

1. Field of the Invention

The present invention relates to an LC filter including a plurality of LC resonators.

2. Description of the Related Art

Conventionally, an LC filter including a plurality of LC resonators is known. For example, International Publication No. 2018/100923 discloses a band pass filter in which four LC resonators are disposed in a staggered manner so that each of the four LC resonators is adjacent to at least two other LC resonators. In a case where the four LC resonators are disposed in a staggered manner, magnetic coupling between LC resonators is stronger than in a case where the four LC resonators are disposed in a straight manner, and therefore a pass band of the band pass filter can be widened.

Bandpass characteristics of an LC filter need to be adjusted in accordance with a communication system in which the LC filter is used. For example, a pass band of an LC filter can be adjusted by adjusting a frequency at which an attenuation pole occurs in each of a frequency band (low-frequency side) lower than the pass band of the LC filter and a frequency band (high-frequency side) higher than the pass band of the LC filter.

However, no attenuation pole occurs on a low-frequency side in bandpass characteristics of the band pass filter in which four LC resonators are disposed in a staggered manner as disclosed in International Publication No. 2018/100923. Therefore, according to this band pass filter, adjustment of the bandpass characteristic is restricted, and it may be difficult to achieve desired bandpass characteristics.

SUMMARY OF THE INVENTION

Preferred embodiments of the present invention provide LC filters in each of which an adjustment of bandpass characteristics is able to be easily provided.

In an LC filter according to a preferred embodiment of the present invention, a plurality of dielectric layers are laminated in a laminating direction. The LC filter includes a first LC resonator, a second LC resonator, a third LC resonator, a fourth LC resonator, and a first ground electrode. The first LC resonator includes a first via conductor and a first capacitor electrode. The first via conductor extends in the laminating direction. The first capacitor electrode is connected to one end of the first via conductor and faces the first ground electrode in the laminating direction. The second LC resonator includes a second via conductor and a second capacitor electrode. The second via conductor extends in the laminating direction. The second capacitor electrode is connected to one end of the second via conductor and faces the first ground electrode in the laminating direction. The third LC resonator includes a third via conductor and a third capacitor electrode. The third via conductor extends in the laminating direction. The third capacitor electrode is connected to one end of the third via conductor and faces the first ground electrode in the laminating direction. The fourth LC resonator includes a fourth via conductor and a fourth capacitor electrode. The fourth via conductor extends in the laminating direction. The fourth capacitor electrode is connected to one end of the fourth via conductor and faces the first ground electrode in the laminating direction. The second capacitor electrode faces each of the first capacitor electrode, the third capacitor electrode, and the fourth capacitor electrode in a direction orthogonal or substantially orthogonal to the laminating direction.

In each of LC filters according to preferred embodiments of the present invention, the second capacitor electrode faces each of the first capacitor electrode, the third capacitor electrode, and the fourth capacitor electrode in a direction orthogonal or substantially orthogonal to the laminating direction, and thus, adjustment of bandpass characteristics of each of the LC filters is able to be easily provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
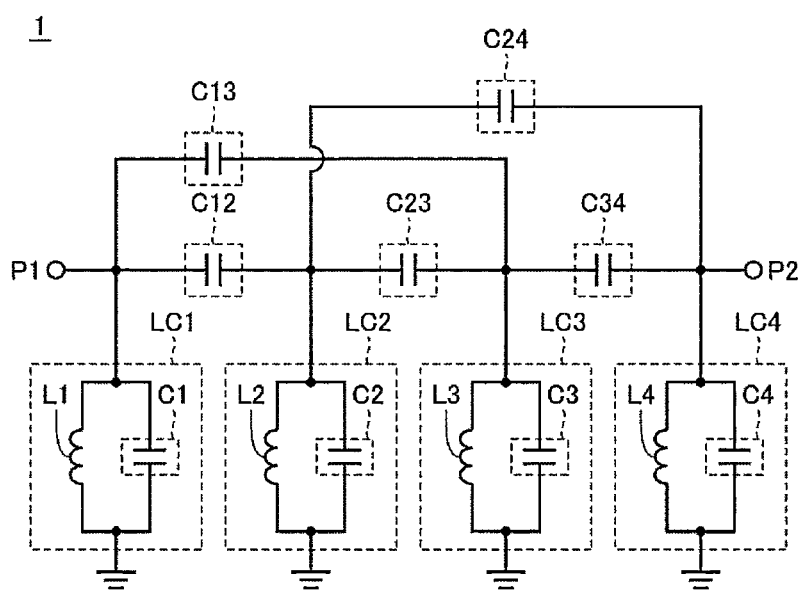
FIG. 1 is an equivalent circuit diagram of a band pass filter which is an example of an LC filter according to Preferred Embodiment 1 of the present invention.

Preferred embodiments of the present invention are described in detail below with reference to the drawings. Note that identical or corresponding portions in the drawings are denoted by the same reference signs, and description thereof is not repeated.

Preferred Embodiment 1

FIG. 1 is an equivalent circuit diagram of a band pass filter 1, which is an example of an LC filter according to Preferred Embodiment 1 of the present invention. As illustrated in FIG. 1, the band pass filter 1 includes input/output terminals P1 and P2, LC parallel resonators LC1 to LC4, a capacitor C12, a capacitor C13, a capacitor C23, a capacitor C24, and a capacitor C34. Hereinafter, a wavelength corresponding to a used frequency (e.g., a center frequency of a pass band) of a band pass filter is λ. Note that the LC filter according to the present preferred embodiment may include an LC series resonator, for example.

The LC parallel resonator LC1 is connected to the input/output terminal P1. The LC parallel resonator LC4 is connected to the input/output terminal P2. Note that the LC parallel resonator LC1 may be connected to the input/output terminal P1 indirectly with an element such as, for example, an inductor or a capacitor interposed therebetween. Similarly, the LC parallel resonator LC4 may be connected to the input/output terminal P2 indirectly with an element such as, for example, an inductor or a capacitor interposed therebetween.

The LC parallel resonators LC2 and LC3 are disposed between the LC parallel resonators LC1 and LC4. The LC parallel resonators LC1 to LC4 are sequentially coupled in accordance with a strength of magnetic coupling and capacitive coupling, which will be described later, to define, for example, a four-stage LC filter.

The capacitor C12 is connected between the LC parallel resonators LC1 and LC2. The capacitor C12 represents capacitive coupling between the LC parallel resonators LC1 and LC2.

The capacitor C13 is connected between the LC parallel resonators LC1 and LC3. The capacitor C13 represents capacitive coupling between the LC parallel resonators LC1 and LC3.

The capacitor C23 is connected between the LC parallel resonators LC2 and LC3. The capacitor C23 represents capacitive coupling between the LC parallel resonators LC2 and LC3.

The capacitor C24 is connected between the LC parallel resonators LC2 and LC4. The capacitor C24 represents capacitive coupling between the LC parallel resonators LC2 and LC4.

The capacitor C34 is connected between the LC parallel resonators LC3 and LC4. The capacitor C34 represents capacitive coupling between the LC parallel resonators LC3 and LC4.

The LC parallel resonator LC1 (first LC resonator) includes an inductor L1 and a capacitor C1. The inductor L1 and the capacitor C1 are connected in parallel between a ground point and a connection point between the input/output terminal P1 and the capacitor C12.

The LC parallel resonator LC2 (second LC resonator) includes an inductor L2 and a capacitor C2. The inductor L2 and the capacitor C2 are connected in parallel between a ground point and a connection point between the capacitors C12 and C23.

The LC parallel resonator LC3 (third LC resonator) includes an inductor L3 and a capacitor C3. The inductor L3 and the capacitor C3 are connected in parallel between a ground point and a connection point between the capacitors C23 and C34.

The LC parallel resonator LC4 (fourth LC resonator) includes an inductor L4 and a capacitor C4. The inductor L4 and the capacitor C4 are connected in parallel between a ground point and a connection point between the capacitor C34 and the input/output terminal P2.

Figure 2:
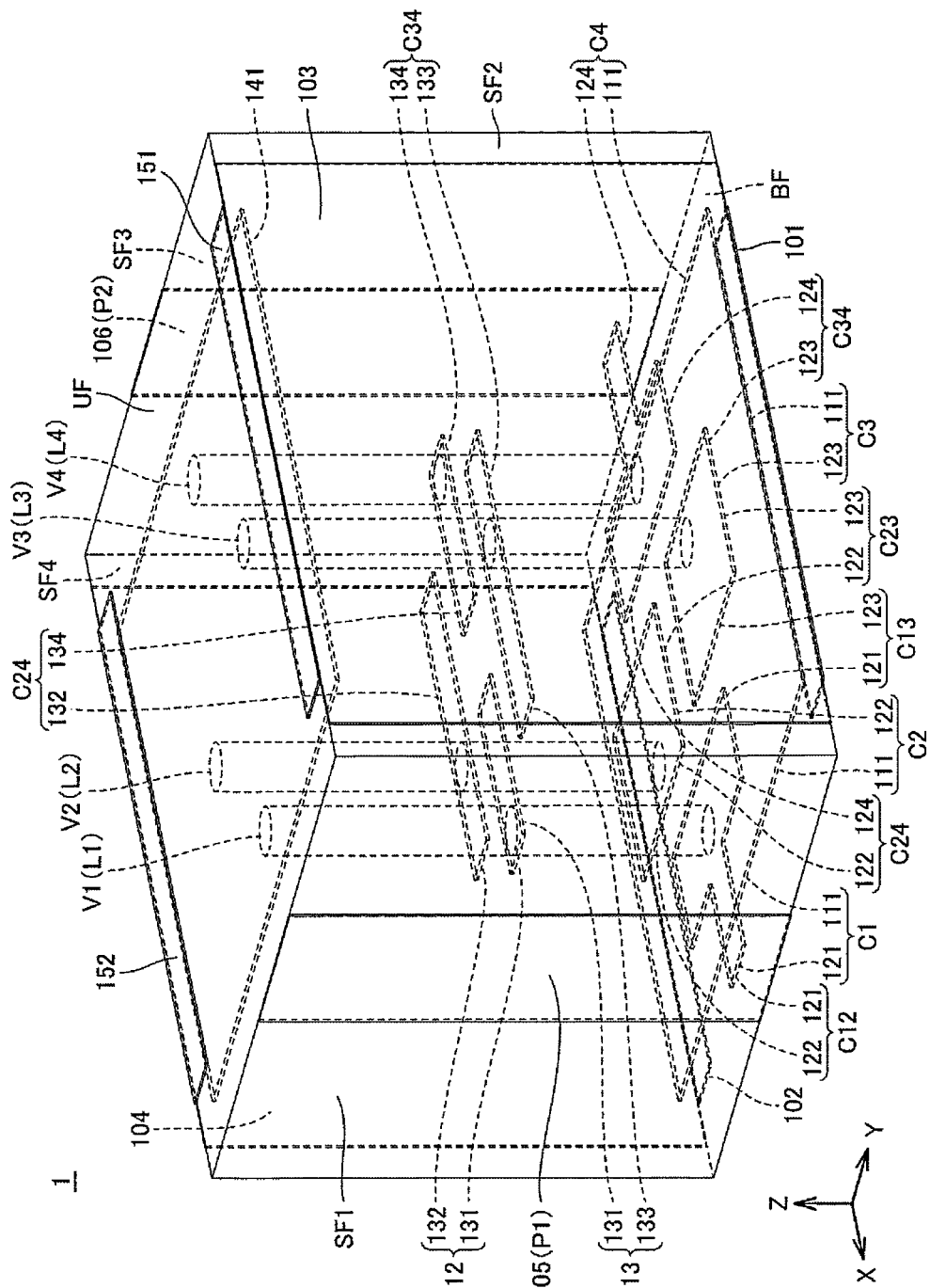
FIG. 2 is an outer perspective view of the band pass filter of FIG. 1.

FIG. 2 is an outer perspective view of the band pass filter 1 of FIG. 1. In FIG. 2, the X axis, the Y axis, and the Z axis are orthogonal or substantially orthogonal to one another. The same applies to FIGS. 3 to 6, 8, 9, 11 to 13, 15 to 17, 19 to 22, 25, 27, and 29, which will be described later.

The band pass filter 1 includes a multilayer body in which a plurality of dielectric layers are laminated in a Z-axis direction (laminating direction) (see FIG. 2). The band pass filter 1 has, for example, a rectangular or substantially rectangular parallelepiped shape. Surfaces of the band pass filter 1 that extend along a direction perpendicular or substantially perpendicular to the Z-axis direction are referred to as a bottom surface BF and an upper surface UF. Among surfaces that extend along a direction parallel or substantially parallel with the laminating direction, surfaces that extend along a YZ plane are referred to as side surfaces SF1 and SF3. Among the surfaces that extend along the laminating direction, surfaces that extend along a ZX plane are referred to as side surfaces SF2 and SF4.

A side surface electrode 105 is disposed on the side surface SF1. The side surface electrode 105 defines the input/output terminal P1. A side surface electrode 106 is disposed on the side surface SF3. The side surface electrode 106 defines the input/output terminal P2.

Ground terminals 101 and 102 are disposed on the bottom surface BF. Ground terminals 151 and 152 are disposed on the upper surface UF. A side surface electrode 103 is disposed on the side surface SF2. The side surface electrode 103 connects the ground terminals 101 and 151. A side surface electrode 104 is disposed on the side surface SF4. The side surface electrode 104 connects the ground terminals 102 and 152. The ground terminals 101, 102, 151, and 152 correspond to the ground points in FIG. 1.

A ground electrode 111 (first ground electrode) and a ground electrode 141 (second ground electrode) are disposed inside the band pass filter 1. The ground electrode 111 faces the bottom surface BF. The ground electrode 141 faces the upper surface UF. Capacitor electrodes 121 to 124, via conductors V1 to V4, and plane electrodes 131 to 134 are disposed between the ground electrodes 111 and 141.

The capacitor electrode 121 (first capacitor electrode) is connected to the side surface electrode 105. The capacitor electrode 121 faces the ground electrode 111. The capacitor electrode 121 and the ground electrode 111 define the capacitor C1. The capacitor electrode 121 and the ground electrode 141 are connected by the via conductor V1 (first via conductor) extending in the Z-axis direction.

The via conductor V1 defines the inductor L1. One end of the via conductor V1 is connected to the capacitor electrode 121. The one end of the via conductor V1 is an open end that is galvanically isolated from the ground electrode 111 by the capacitor electrode 121. The LC parallel resonator LC1 is, for example, a $\lambda/4$ resonator. A length of the via conductor V1 is equal or substantially equal to $\lambda/4$.

The capacitor electrode 122 (second capacitor electrode) faces the ground electrode 111. The capacitor electrode 122 and the ground electrode 111 define the capacitor C2. The capacitor electrode 122 and the ground electrode 141 are connected by the via conductor V2 (second via conductor) extending in the Z-axis direction. The capacitor electrode 122 faces the capacitor electrode 121 in an X-axis direction. The capacitor electrodes 121 and 122 define the capacitor C12.

The via conductor V2 defines the inductor L2. One end of the via conductor V2 is connected to the capacitor electrode 122. The one end of the via conductor V2 is an open end that is galvanically isolated from the ground electrode 111 by the capacitor electrode 122. The LC parallel resonator LC2 is, for example, a $\lambda/4$ resonator. A length of the via conductor V2 is equal or substantially equal to $\lambda/4$.

The capacitor electrode 123 (third capacitor electrode) faces the ground electrode 111. The capacitor electrode 123 and the ground electrode 111 define the capacitor C3. The capacitor electrode 123 and the ground electrode 141 are connected by the via conductor V3 (third via conductor) extending in the Z-axis direction. The capacitor electrode 123 faces the capacitor electrode 122 in a Y-axis direction. The capacitor electrodes 122 and 123 form the capacitor C23. The capacitor electrode 123 faces the capacitor electrode 121 in the X-axis direction. The capacitor electrodes 121 and 123 define the capacitor C13.

The via conductor V3 defines the inductor L3. One end of the via conductor V3 is connected to the capacitor electrode 123. The one end of the via conductor V3 is an open end that is galvanically isolated from the ground electrode 111 by the capacitor electrode 123. The LC parallel resonator LC3 is, for example, a $\lambda/4$ resonator. A length of the via conductor V3 is equal or substantially equal to $\lambda/4$.

The capacitor electrode 124 (fourth capacitor electrode) is connected to the side surface electrode 106. The capacitor electrode 124 faces the ground electrode 111. The capacitor electrode 124 and the ground electrode 111 define the capacitor C4. The capacitor electrode 124 and the ground electrode 141 are connected by the via conductor V4 (fourth via conductor) extending in the Z-axis direction. The capacitor electrode 124 faces the capacitor electrodes 122 and 123 in the X-axis direction. The capacitor electrodes 122 and 124 define the capacitor C24. The capacitor electrodes 123 and 124 define the capacitor C34.

The via conductor V4 defines the inductor L4. One end of the via conductor V4 is connected to the capacitor electrode 124. The one end of the via conductor V4 is an open end that is galvanically isolated from the ground electrode 111 by the capacitor electrode 124. The LC parallel resonator LC4 is, for example, a $\lambda/4$ resonator. A length of the via conductor V4 is equal or substantially equal to $\lambda/4$.

The plane electrode 131 is connected to the via conductor V1 between both ends of the via conductor V1. The plane electrode 132 is connected to the via conductor V2 between both ends of the via conductor V2. The plane electrode 133 is connected to the via conductor V3 between both ends of the via conductor V3. The plane electrode 134 is connected to the via conductor V4 between both ends of the via conductor V4.

At least a portion of one side of the plane electrode 132 faces at least a portion of one side of each of the plane electrodes 131 and 134 in the Y-axis direction. The plane electrodes 131 and 132 define the capacitor C12. The plane electrodes 132 and 134 define the capacitor C24.

At least a portion of one side of the plane electrode 133 faces at least a portion of one side of each of the plane electrodes 131 and 134 in the Y-axis direction. The plane electrodes 131 and 133 define the capacitor C13. The plane electrodes 133 and 134 define the capacitor C34.

In the band pass filter 1, capacitance of the capacitor C12, capacitance of the capacitor C13, capacitance of the capacitor C24, and capacitance of the capacitor C34 can be individually adjusted by changing shapes and positions of the plane electrodes 131 to 134. As a result, characteristics of the band pass filter 1 can be adjusted to be close to desired characteristics with high accuracy.

Figure 3:
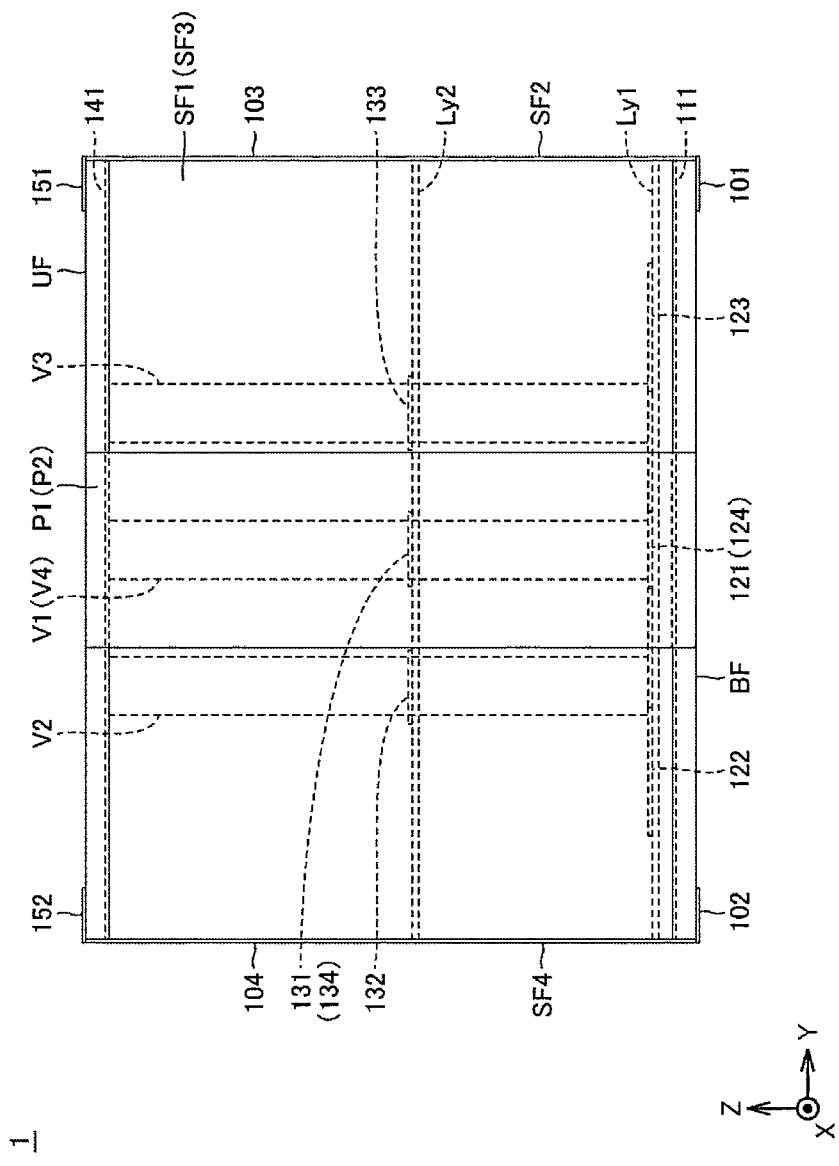
FIG. 3 is a plan view of a side surface of the band pass filter of FIG. 2 viewed from the X-axis direction.

FIG. 3 is a plan view of the side surface SF1 of the band pass filter 1 of FIG. 2 viewed from the X-axis direction. As illustrated in FIG. 3, the capacitor electrodes 121 to 124 are disposed in a dielectric layer Ly1. By providing the capacitor electrodes 121 to 124 in the same dielectric layer, the height of the band pass filter 1 can be reduced.

In a case where the band pass filter 1 is produced by using ceramic multilevel substrate technology, a plurality of ceramic sheets in which a plurality of the same or substantially the same wire conductor patterns and through conductors are provided in a plane direction are laminated and burned to form a multilayer aggregate, and the multilayer aggregate is divided in the plane direction to produce individual band pass filters 1. In a case where characteristics of the band pass filter 1 are adjusted in accordance with a communication system, a trial multilayer aggregate in which shapes and positions of wire conductor patterns corresponding to the capacitor electrodes 121 to 124 are changed in the plane direction is provided, and this trial multilayer aggregate is divided to produce a plurality of trial band pass filters 1 having different characteristics. A band pass filter 1 that matches needed characteristics is extracted from among the trial band pass filters 1, and a plane electrode pattern the same or substantially the same as this band pass filter 1 is used as a pattern for mass production. In this way, characteristics of the band pass filter 1 can be adjusted efficiently.

The plane electrodes 131 to 134 are disposed in a dielectric layer Ly2. By providing the plane electrodes 131 to 134 in the same dielectric layer, the height of the band pass filter 1 can be reduced.

Figure 4:
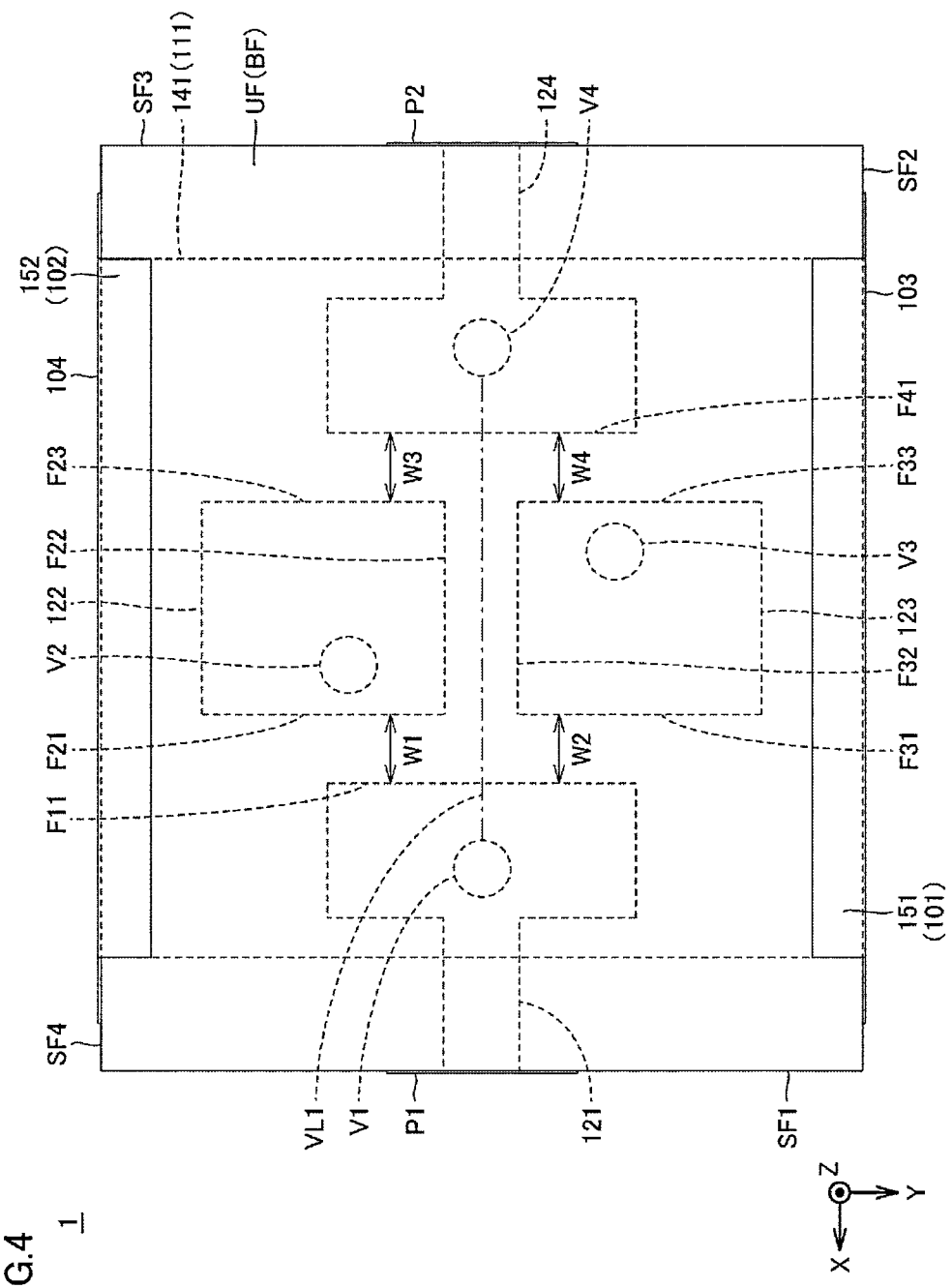
FIG. 4 is a plan view of an upper surface of the band pass filter of FIG. 2 viewed from the Z-axis direction.

FIG. 4 is a plan view of the upper surface UF of the band pass filter 1 of FIG. 2 viewed from the Z-axis direction. In FIG. 4, the plane electrodes 131 to 134 are not illustrated to emphasize characteristic positions of the capacitor electrodes 121 to 124.

As illustrated in FIG. 4, the via conductors V2 and V3 are disposed on both sides of a virtual line VL1 connecting the via conductors V1 and V4, respectively. That is, the via conductors V1 and V4 are located on the virtual line VL1, and the via conductors V2 and V3 are not located on the virtual line VL1. The via conductor V2 is disposed on one side of the virtual line VL1, and the via conductor V3 is disposed on the other side of the virtual line VL1. When the band pass filter 1 is viewed in plan view from the Y-axis direction, the via conductors V2 and V3 are sandwiched between the via conductors V1 and V4.

In general, each LC resonator is coupled with another LC resonator by magnetic coupling and capacitive coupling. The strength of the magnetic coupling and capacitive coupling is determined by shapes and positional relationship of the LC resonators. The LC resonators are sequentially coupled in accordance with strength of overall coupling combining magnetic coupling and capacitive coupling to define an LC filter.

For example, it is assumed in Preferred Embodiment 1 that magnetic coupling is dominant over capacitive coupling. A distance between the via conductors V1 and V2 is shorter than a distance between the via conductors V1 and V3. Accordingly, magnetic coupling between the LC parallel resonators LC1 and LC2 is stronger than magnetic coupling between the LC parallel resonators LC1 and LC3.

A distance between the via conductors V4 and V3 is shorter than a distance between the via conductors V4 and V2. Accordingly, magnetic coupling between the LC parallel resonators LC4 and LC3 is stronger than magnetic coupling between the LC parallel resonators LC4 and LC2. As a result, the LC parallel resonator LC1, the LC parallel resonator LC2, the LC parallel resonator LC3, and the LC parallel resonator LC4 are coupled in this order from the input/output terminal P1 side to define a four-stage LC filter.

The capacitor electrodes 122 and 123 are disposed between the capacitor electrodes 121 and 124 in the X-axis direction. The capacitor electrodes 122 and 123 are disposed side by side in the Y-axis direction. The capacitor electrode 121 is adjacent to the capacitor electrodes 122 and 123. The capacitor electrode 124 is adjacent to the capacitor electrodes 122 and 123. That is, the capacitor electrodes 121 to 124 are disposed in a staggered (zigzag) manner. As a result, the LC parallel resonators LC1 to LC4 of FIG. 1 are also disposed in a staggered manner. In a case where the LC parallel resonators LC1 to LC4 are disposed in a staggered manner, magnetic coupling between LC parallel resonators is stronger than in a case where the LC parallel resonators LC1 to LC4 are disposed in a straight manner. As a result, signal transmission between inductors is promoted, and thus the pass band of the band pass filter 1 can be widened.

The capacitor electrode 122 includes an outer peripheral portion F21 (first outer peripheral portion) and an outer peripheral portion F23 (third outer peripheral portion) that faces the capacitor electrodes 121 and 124 in the X-axis direction, respectively. The capacitor electrode 122 includes an outer peripheral portion F22 (second outer peripheral portion) that faces the capacitor electrode 123 in the Y-axis direction.

The capacitor electrode 121 includes an outer peripheral portion F11 (fourth outer peripheral portion) that faces the outer peripheral portion F21. The capacitor electrode 123 includes an outer peripheral portion F32 (fifth outer peripheral portion) that faces the outer peripheral portion F22. The capacitor electrode 124 includes an outer peripheral portion F41 (sixth outer peripheral portion) that faces the outer peripheral portion F23. The capacitor electrode 123 includes outer peripheral portions F31 and F33 that face the outer peripheral portions F11 and F41, respectively.

The outer peripheral portions F21 to F23 are parallel or substantially parallel with the outer peripheral portion F11, the outer peripheral portion F32, and the outer peripheral portion F41, respectively. The outer peripheral portions F31 and F33 are parallel or substantially parallel with the outer peripheral portions F11 and F41, respectively.

By disposing the capacitor electrodes 121 to 124 so that two outer peripheral portions that face each other become parallel or substantially parallel, the two outer peripheral portions that face each other can have a configuration closer to one capacitor. As a result, it becomes easier to adjust capacitive coupling between LC resonators. Two outer peripheral portions that face each other in an LC filter according to a preferred embodiment of the present invention need not be parallel or substantially parallel, and for example, one of the two outer peripheral portions that face each other may have a wave shape or a zigzag shape, for example.

An interval W1 is an interval between the capacitor electrodes 121 and 122 in the X-axis direction. An interval W2 is an interval between the capacitor electrodes 121 and 123 in the X-axis direction. An interval W3 is an interval between the capacitor electrodes 122 and 124 in the X-axis direction. An interval W4 is an interval between the capacitor electrodes 123 and 124 in the X-axis direction. The following explains that the pass band of the band pass filter 1 can be adjusted by changing the intervals W1 to W4 with reference to FIGS. 5 to 10. In FIGS. 5 to 10, electrodes other than the capacitor electrodes 121 to 124 and the via conductors V1 to V4 are not illustrated to emphasize a change of an interval between two capacitor electrodes.

Figure 5:
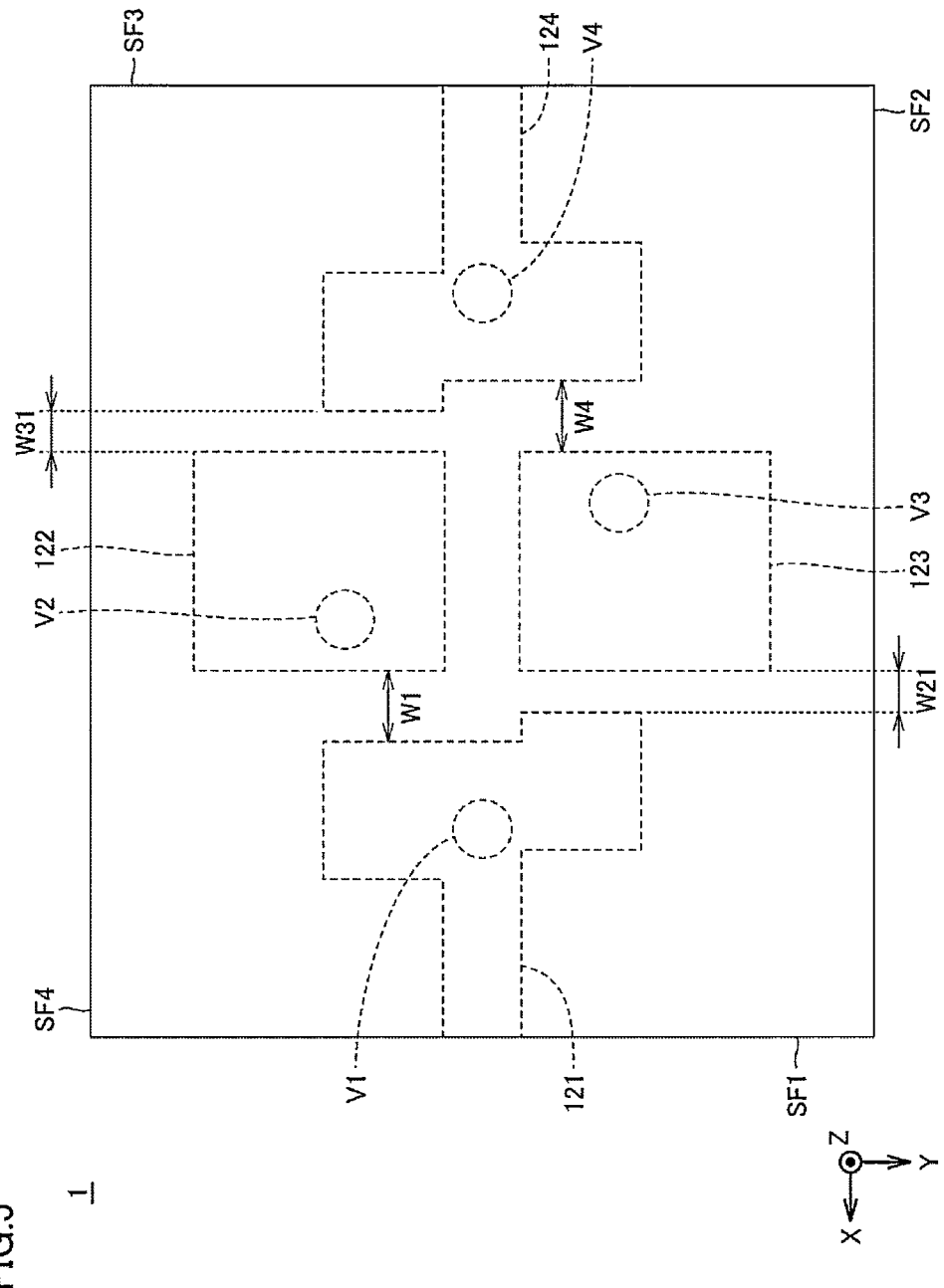
FIG. 5 illustrates an example in which an interval between two capacitor electrodes of FIG. 4 is narrowed.

FIG. 5 illustrates an example in which the interval W2 between the capacitor electrodes 121 and 123 in FIG. 4 and the interval W3 between the capacitor electrodes 122 and 124 in FIG. 4 are narrowed. In FIG. 5, capacitance values of the capacitors C13 and C24 in FIG. 1 are increased as compared to FIG. 4.

In FIG. 5, the interval between the capacitor electrodes 121 and 123 is narrowed from W2 to W21 (<W2) (see FIGS. 4 and 5). The interval between the capacitor electrodes 122 and 124 is narrowed from W3 to W31 (<W3).

Figure 6:
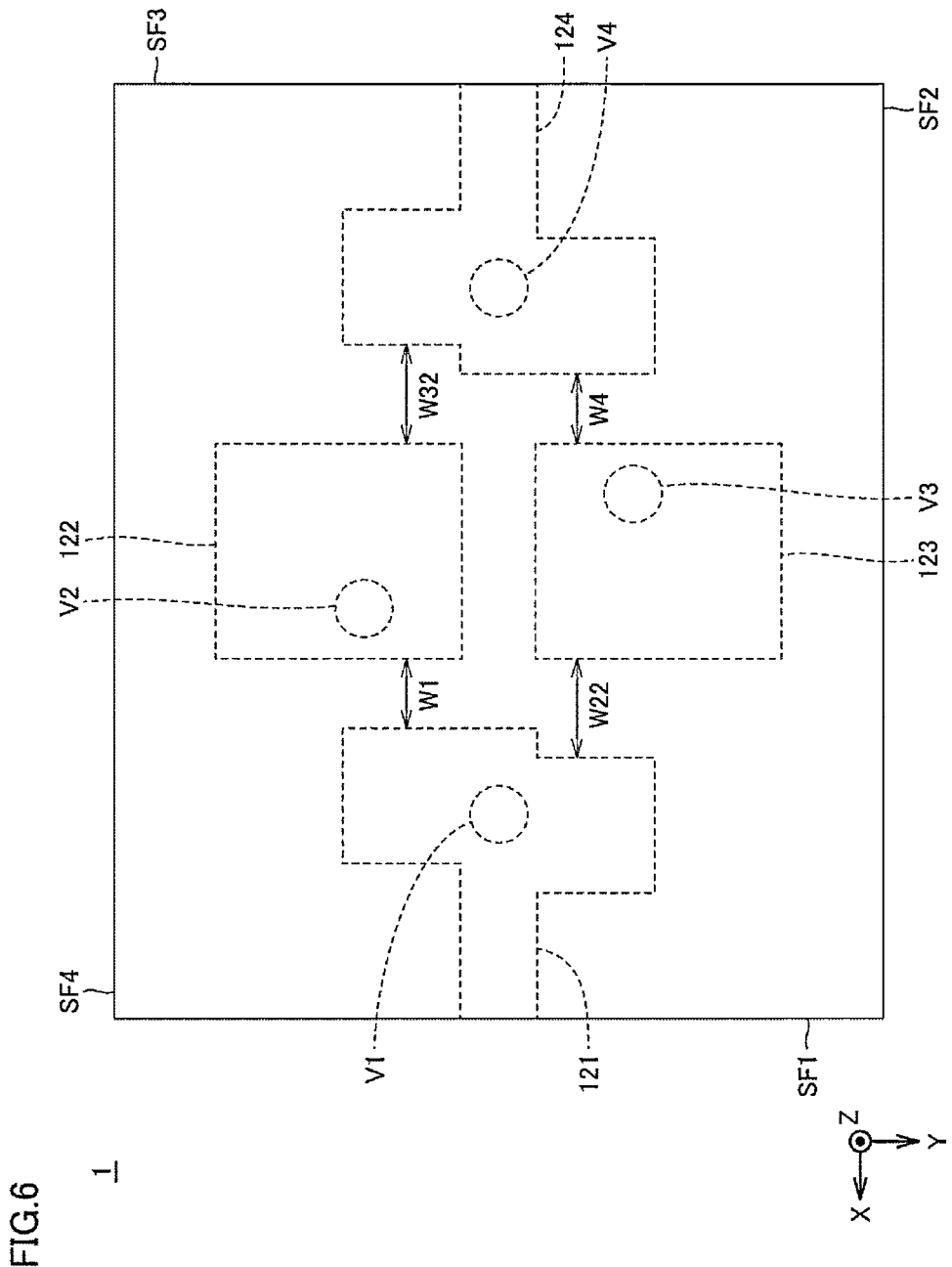
FIG. 6 illustrates an example in which an interval between two capacitor electrodes of FIG. 4 is widened.

FIG. 6 illustrates an example in which the interval W2 between the capacitor electrodes 121 and 123 in FIG. 4 and the interval W3 between the capacitor electrodes 122 and 124 in FIG. 4 are widened. In FIG. 6, capacitance values of the capacitors C13 and C24 in FIG. 1 are decreased as compared to FIG. 4.

In FIG. 6, the interval between the capacitor electrodes 121 and 123 is widened from W2 to W22 (>W2) (see FIGS. 4 and 6). The interval between the capacitor electrodes 122 and 124 is widened from W3 to W32 (>W3).

Figure 7:
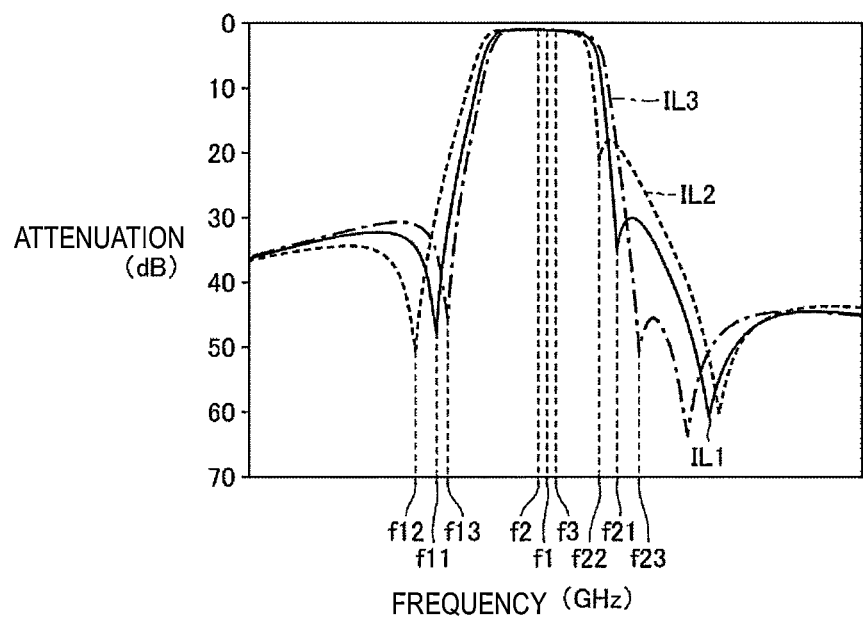
FIG. 7 illustrates bandpass characteristics of band pass filters illustrated in FIGS. 4 to 6.

FIG. 7 illustrates bandpass characteristics IL1 to IL3 of the band pass filters 1 illustrated in FIGS. 4 to 6. Note that bandpass characteristics of a band pass filter are frequency characteristics of an insertion loss of the band pass filter. The insertion loss becomes a maximum at a frequency where an attenuation pole occurs.

As indicated by the bandpass characteristics IL1, an attenuation pole occurs at a frequency f11 on a low-frequency side of the pass band of the band pass filter 1 of FIG. 4 (see FIG. 7). An attenuation pole occurs at a frequency f21 on a high-frequency side of the pass band. A center frequency of the pass band of the band pass filter 1 is f1.

As indicated by the bandpass characteristics IL2, an attenuation pole occurs at a frequency f12 (<f11) on a low-frequency side of the pass band of the band pass filter 1 of FIG. 5. An attenuation pole occurs at a frequency f22 (<f21) on a high-frequency side of the pass band. A center frequency of the pass band of the band pass filter 1 of FIG. 5 is f2 (<f1). Regarding an attenuation pole on a low-frequency side, an attenuation at the frequency f12 of the bandpass characteristics IL2 is larger than an attenuation at the frequency f11 of the bandpass characteristics IL1. Regarding an attenuation pole on a high-frequency side, an attenuation at the frequency f22 of the bandpass characteristics IL12 is smaller than an attenuation at the frequency f21 of the bandpass characteristics IL1.

As indicated by the bandpass characteristics IL3, an attenuation pole occurs at a frequency f13 (>f11) on a low-frequency side of the pass band of the band pass filter 1 of FIG. 6. An attenuation pole occurs at a frequency f23 (>f21) on a high-frequency side of the pass band. A center frequency of the pass band of the band pass filter 1 is f3 (>f1). Regarding an attenuation pole on a low-frequency side, an attenuation at the frequency f13 of the bandpass characteristics IL3 is smaller than an attenuation at the frequency f11 of the bandpass characteristics IL1. Regarding an attenuation pole on a high-frequency side, an attenuation at the frequency f23 of the bandpass characteristics IL3 is larger than an attenuation at the frequency f21 of the bandpass characteristics IL1.

As illustrated in FIG. 7, bandpass characteristics of the band pass filter 1 can be shifted to a low-frequency side by increasing the capacitance of the capacitors C13 and C24 of FIG. 1. As a result, the center frequency of the band pass filter 1 can be reduced. Furthermore, the bandpass characteristics of the band pass filter 1 can be shifted to a high-frequency side by decreasing capacitance of the capacitors C13 and C24 of FIG. 1. As a result, the center frequency of the band pass filter 1 can be made increased.

Figure 8:
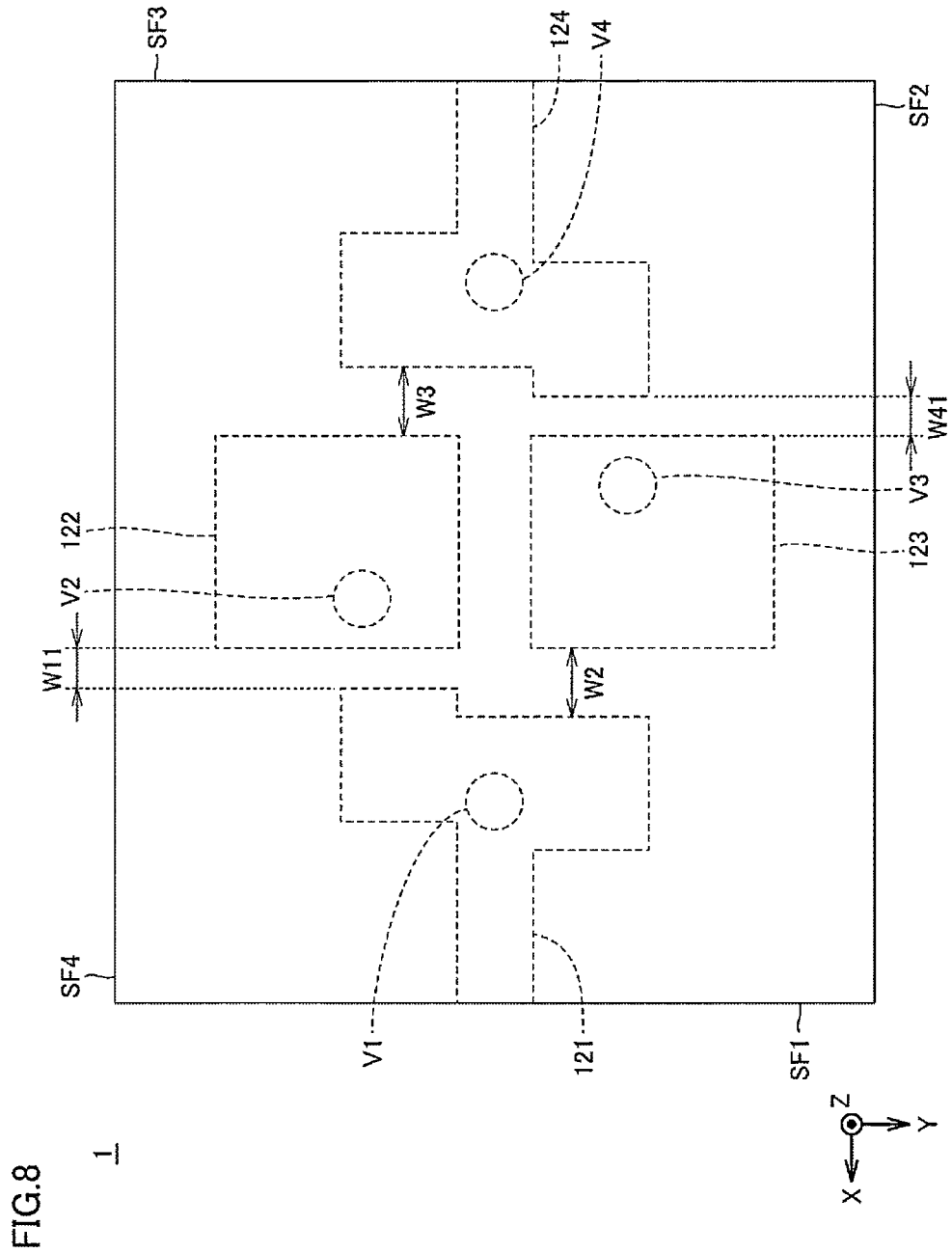
FIG. 8 illustrates another example in which an interval between two capacitor electrodes of FIG. 4 is narrowed.

FIG. 8 illustrates an example in which the interval W1 between the capacitor electrodes 121 and 122 in FIG. 4 and the interval W4 between the capacitor electrodes 123 and 124 in FIG. 4 are narrowed. In FIG. 8, capacitance values of the capacitors C12 and C34 of FIG. 1 are increased as compared to FIG. 4.

In FIG. 8, the interval between the capacitor electrodes 121 and 122 is narrowed from W1 to W11 (<W1) (see FIGS. 4 and 8). The interval between the capacitor electrodes 123 and 124 is narrowed from W4 to W41 (<W4).

Figure 9:
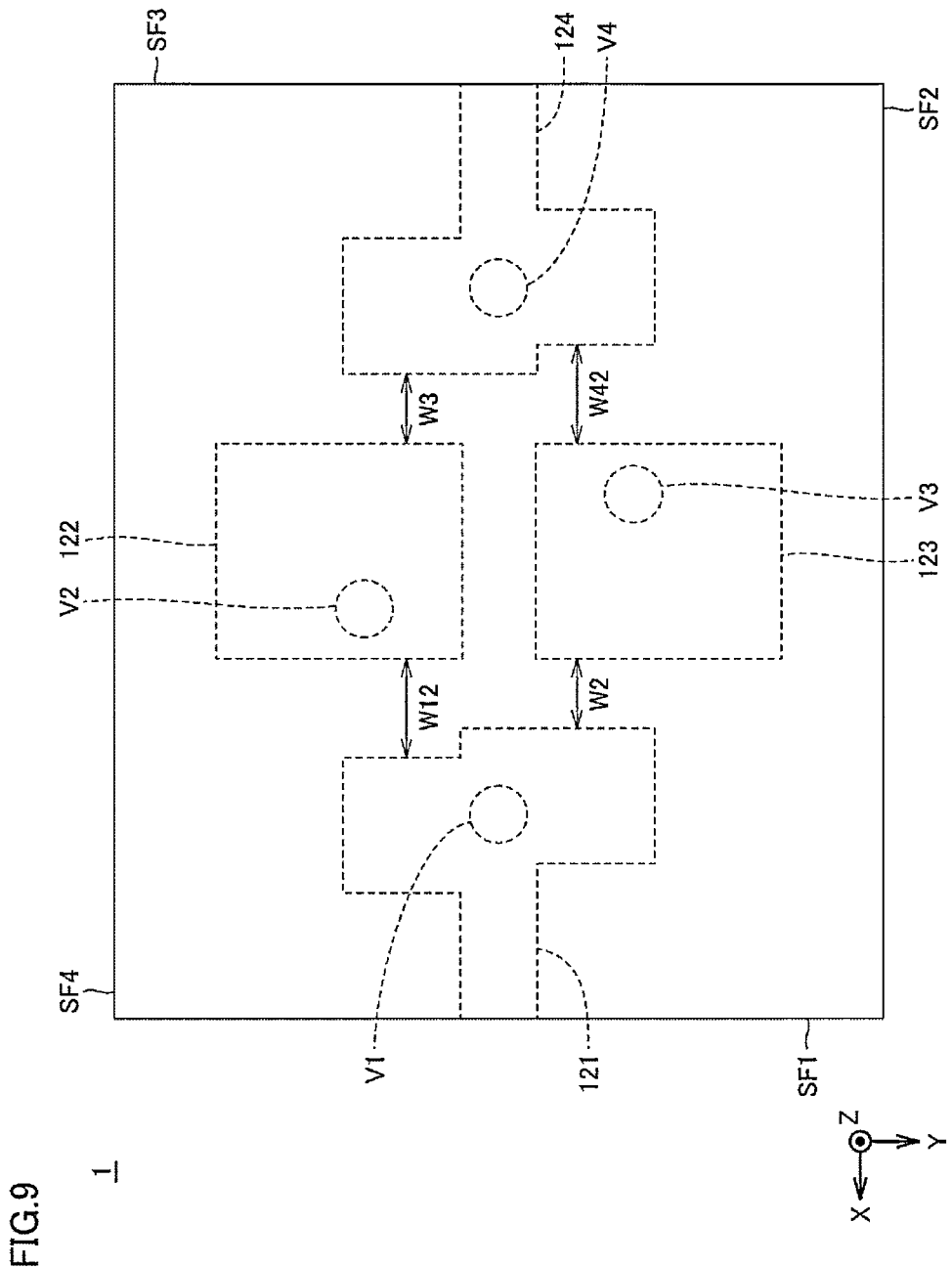
FIG. 9 illustrates another example in which an interval between two capacitor electrodes of FIG. 4 is widened.

FIG. 9 illustrates an example in which the interval W1 between the capacitor electrodes 121 and 122 in FIG. 4 and the interval W4 between the capacitor electrodes 123 and 124 in FIG. 4 are widened. In FIG. 9, capacitance values of the capacitors C12 and C34 of FIG. 1 are decreased as compared to FIG. 4.

In FIG. 9, the interval between the capacitor electrodes 121 and 122 is widened from W1 to W12 (>W1) (see FIGS. 4 and 9). The interval between the capacitor electrodes 123 and 124 is widened from W4 to W42 (>W4).

Figure 10:
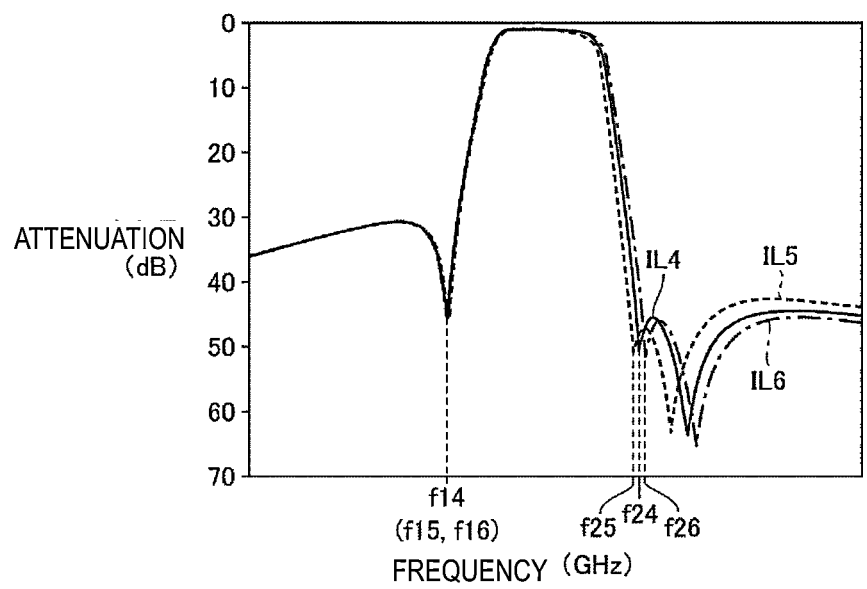
FIG. 10 illustrates bandpass characteristics of band pass filters illustrated in FIGS. 4, 8, and 9.

FIG. 10 illustrates bandpass characteristics IL4 to IL6 of the band pass filters 1 illustrated in FIGS. 4, 8, and 9.

As indicated by the bandpass characteristic IL4, an attenuation pole occurs at a frequency f14 on a low-frequency side of the pass band of the band pass filter 1 of FIG. 4 (see FIG. 10). An attenuation pole occurs at a frequency f24 on a high-frequency side of the pass band.

As indicated by the bandpass characteristics IL5, an attenuation pole occurs at a frequency f15 (≈f14) on a low-frequency side of the pass band of the band pass filter 1 of FIG. 8. An attenuation pole occurs at a frequency f25 (<f24) on a high-frequency side of the pass band.

As indicated by the bandpass characteristics IL6, an attenuation pole occurs at a frequency f16 (≈f14) on a low-frequency side of the pass band of the band pass filter 1 of FIG. 9. An attenuation pole occurs at a frequency f26 (>f21) on a high-frequency side of the pass band.

As illustrated in FIG. 10, a frequency at which an attenuation pole occurs on a high-frequency side of the band pass filter 1 can be made low by increasing the capacitance of the capacitors C12 and C34 of FIG. 1. As a result, a band width of the pass band of the band pass filter 1 can be narrowed. Furthermore, a frequency at which an attenuation pole occurs on a high-frequency side of the band pass filter 1 can be made high by decreasing the capacitance of the capacitors C12 and C34 of FIG. 1. As a result, a band width of the pass band of the band pass filter 1 can be widened.

Modification 1 of Preferred Embodiment 1

In Preferred Embodiment 1, a configuration in which distances between adjacent via conductors are different has been described. In Modification 1 of Preferred Embodiment 1, a configuration in which distances between adjacent via conductors are equal or substantially equal is described.

Figure 11:
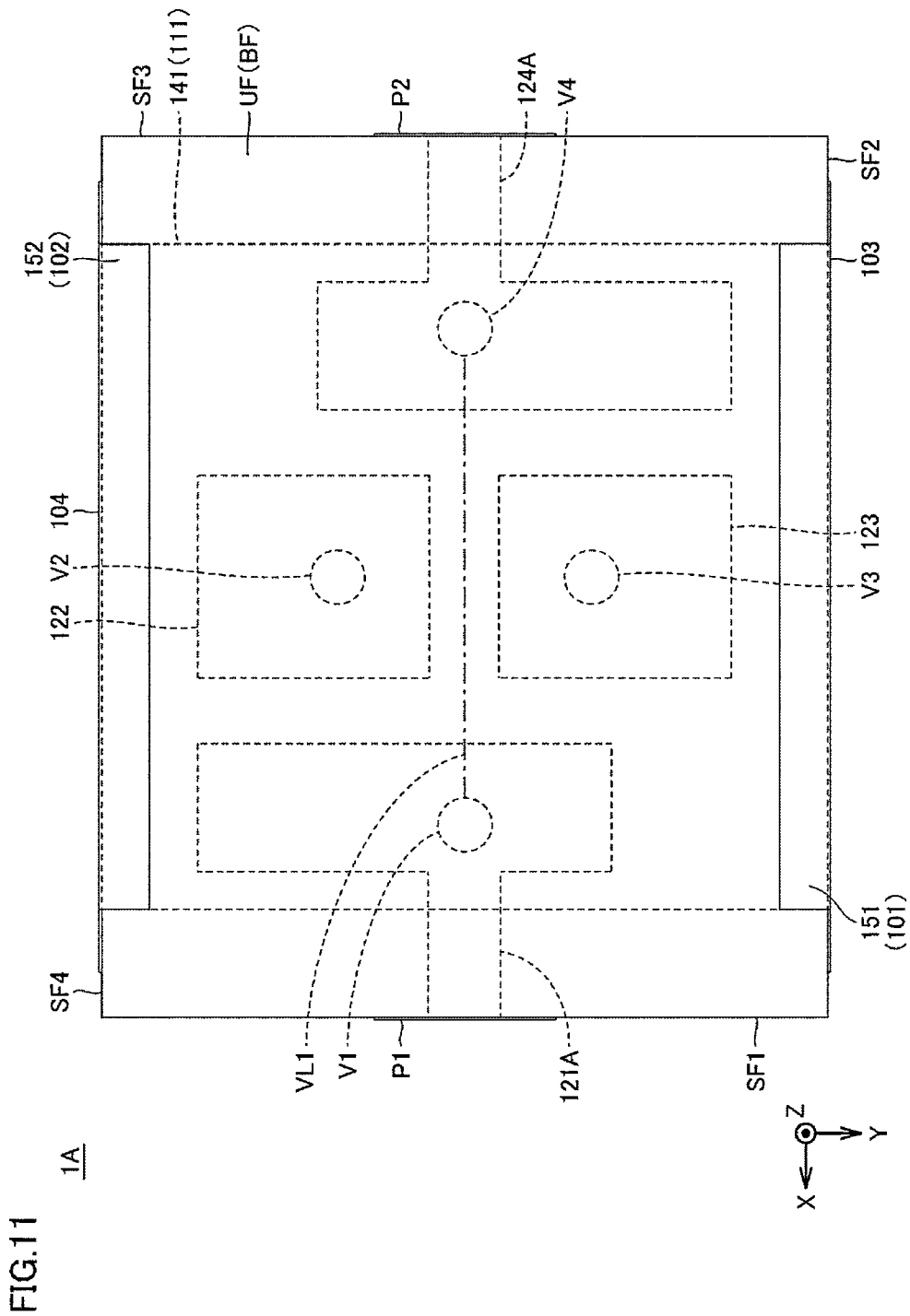
FIG. 11 is a plan view of a band pass filter which is an example of an LC filter according to Modification 1 of Preferred Embodiment 1 of the present invention viewed from the Z-axis direction.

FIG. 11 is a plan view of a band pass filter 1A, which is an example of an LC filter according to Modification 1 of Preferred Embodiment 1, viewed from the Z-axis direction. A configuration of the band pass filter 1A is the same as or similar to the configuration of the band pass filter 1 of FIG. 4, except for that the capacitor electrodes 121 and 124 of the band pass filter 1 are replaced with capacitor electrodes 121A and 124A, respectively and positions of the via conductors V2 and V3 are moved, and repeated description of the same or similar points is omitted.

As illustrated in FIG. 11, the via conductors V1 to V4 are disposed in a shape of a rhombus. A distance between the via conductors V1 and V2 is equal or substantially equal to a distance between the via conductors V1 and V3. Accordingly, magnetic coupling between the via conductors V1 and V2 is equal or substantially equal to magnetic coupling between the via conductors V1 and V3. A distance between the via conductors V4 and V3 is equal or substantially equal to a distance between the via conductors V4 and V2. Accordingly, magnetic coupling between the via conductors V4 and V3 is equal or substantially equal to magnetic coupling between the via conductors V4 and V2. The distance between the via conductors V1 and V2 is equal or substantially to the distance between the via conductors V2 and V4.

The capacitor electrode 121A (first capacitor electrode) faces the capacitor electrodes 122 and C123 in the X-axis direction. A portion of the capacitor electrode 121A that faces the capacitor electrode 122 is longer than a portion of the capacitor electrode 121A that faces the capacitor electrode 123. That is, a capacitance value of the capacitor C12 of FIG. 1 is larger than a capacitance value of the capacitor C13.

The capacitor electrode 124A (fourth capacitor electrode) faces the capacitor electrodes 122 and C123 in the X-axis direction. A portion of the capacitor electrode 124A that faces the capacitor electrode 123 is longer than a portion of the capacitor electrode 124A that faces the capacitor electrode 122. That is, a capacitance value of the capacitor C34 of FIG. 1 is larger than a capacitance value of the capacitor C24.

Modification 2 of Preferred Embodiment 1

In Preferred Embodiment 1, a configuration in which an electrode that defines an input/output terminal is disposed on a side surface (outer peripheral surface) of an LC filter including a multilayer body has been described. An input/output terminal may be provided on a surface other than the outer peripheral surface of the multilayer body. In Modification 2 of the Preferred Embodiment 1, a configuration in which an input/output terminal of a band pass filter is provided as a Land Grid Array (LGA) terminal regularly disposed on a bottom surface of a multilayer body is described.

Figure 12:
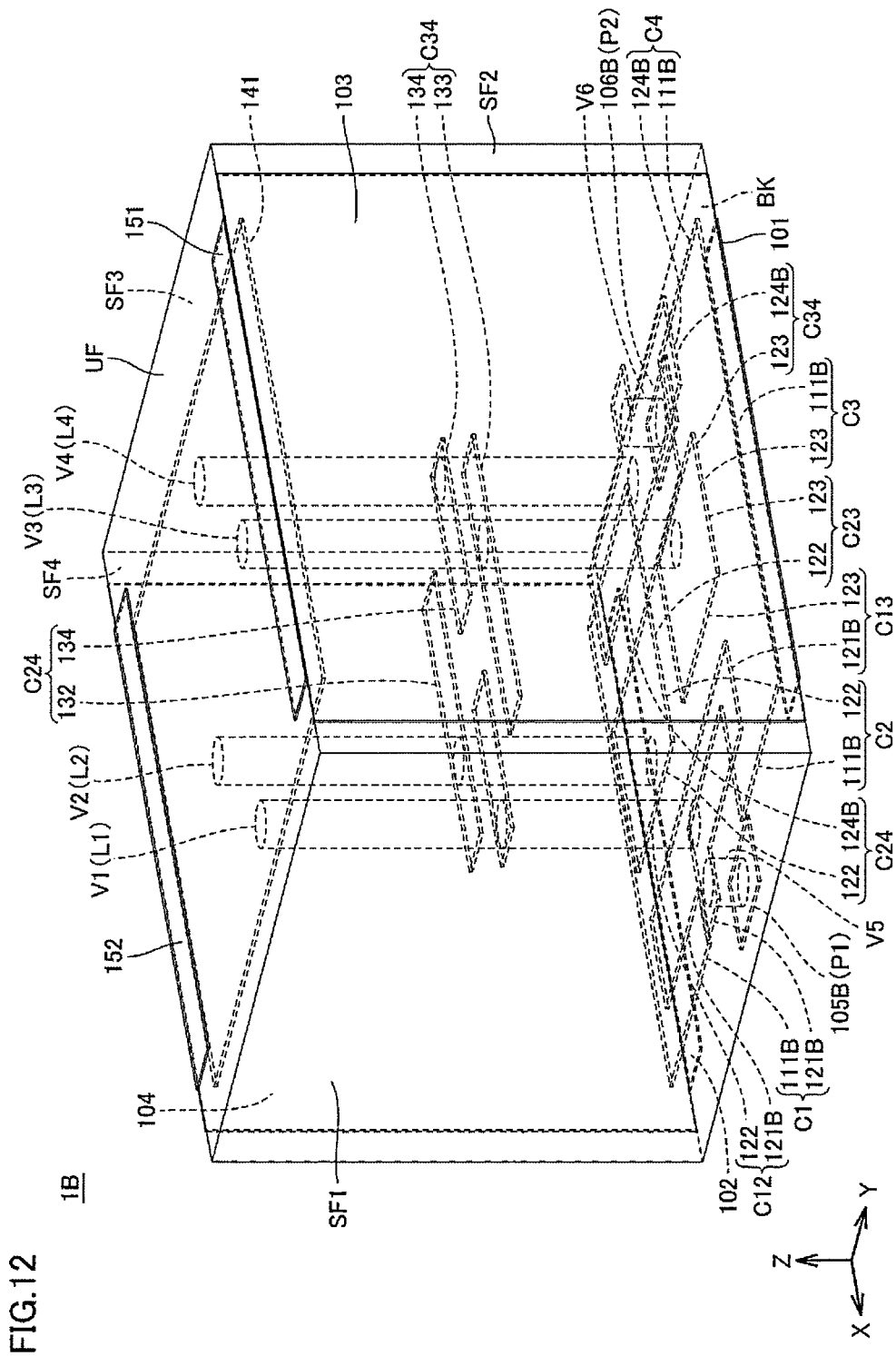
FIG. 12 is an outer perspective view of a band pass filter which is an example of an LC filter according to Modification 2 of Preferred Embodiment 1 of the present invention.
Figure 13:
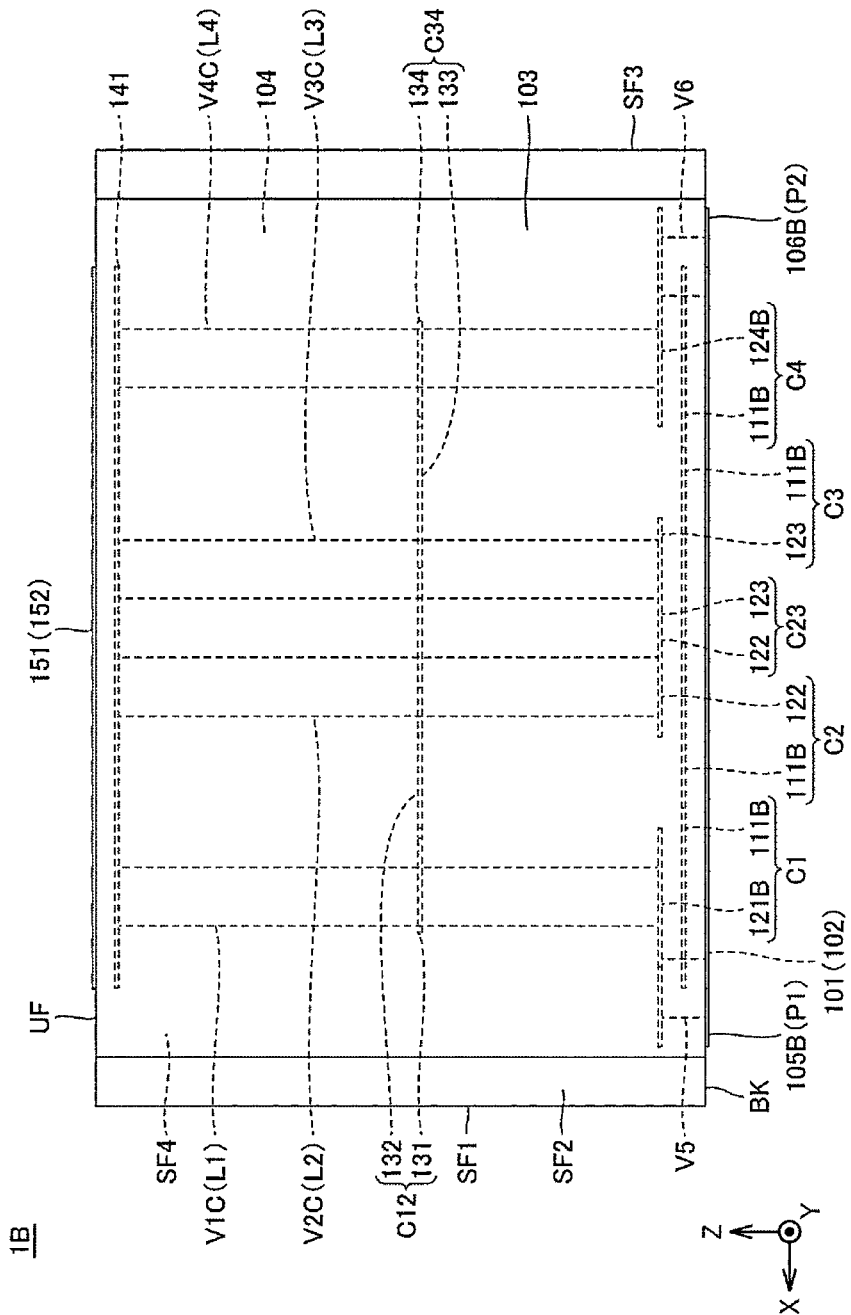
FIG. 13 is a plan view of a side surface of the band pass filter of FIG. 12 viewed from the Y-axis direction.

FIG. 12 is an outer perspective view of a band pass filter 1B, which is an example of an LC filter according to Modification 2 of Preferred Embodiment 1. FIG. 13 is a plan view of the side surface SF2 of the band pass filter 1B of FIG. 12 viewed from the Y-axis direction. A configuration of the band pass filter 1B is the same or similar to the configuration of the band pass filter 1 of FIG. 2, except for that the side surface electrodes 105 and 106, the ground electrode 111, and the capacitor electrodes 121 and 124 of the band pass filter 1 are replaced with LGA terminals 105B and 106B, a ground electrode 111B, and capacitor electrodes 121B and 124B, respectively and via conductors V5 and V6 are added, and repeated description of the same or similar points is omitted.

As illustrated in FIGS. 12 and 13, the LGA terminal 105B and the capacitor electrode 121B are connected by the via conductor V5. The LGA terminal 106B and the capacitor electrode 124B are connected by the via conductor V6.

Modification 3 of Preferred Embodiment 1

In Preferred Embodiment 1, a configuration in which one end of an inductor of an LC resonator included in an LC filter is an open end has been described. In Modification 3 of Preferred Embodiment 1, a configuration in which both ends of the inductor are open ends is described.

Figure 14:
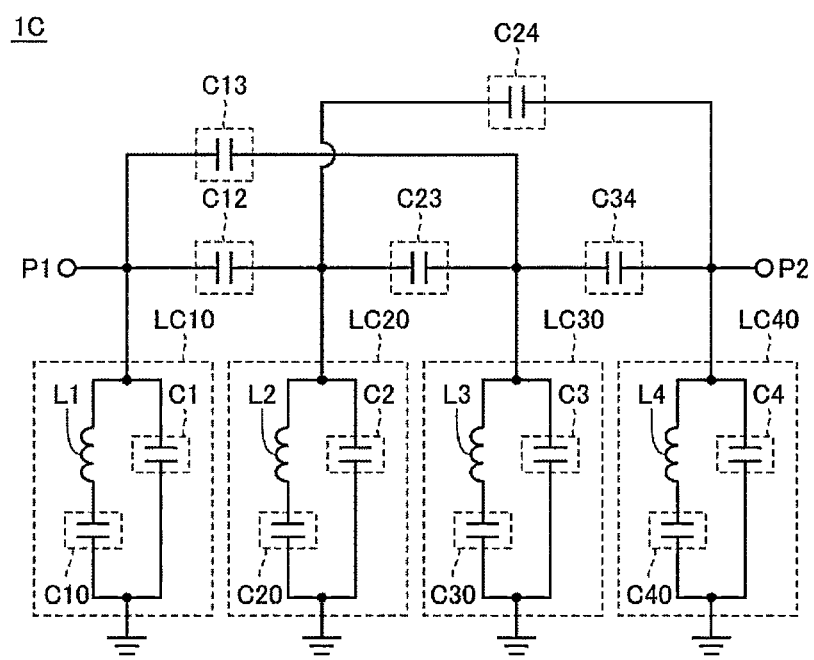
FIG. 14 is an equivalent circuit diagram of a band pass filter which is an example of an LC filter according to Modification 3 of Preferred Embodiment 1 of the present invention.

FIG. 14 is an equivalent circuit diagram of a band pass filter 1C, which is an example of an LC filter according to Modification 3 of Preferred Embodiment 1. The equivalent circuit diagram illustrated in FIG. 14 is the same as or similar to the equivalent circuit diagram illustrated in FIG. 1, except for that capacitors C10, C20, C30, and C40 are added to the LC parallel resonators LC1 to LC4 of the equivalent circuit diagram illustrated in FIG. 1, and repeated description of the same or similar points is omitted.

As illustrated in FIG. 14, the capacitor C10 is connected between the inductor L1 and the ground point. The capacitor C20 is connected between the inductor L2 and the ground point. The capacitor C30 is connected between the inductor L3 and the ground point. The capacitor C40 is connected between the inductor L4 and the ground point.

Figure 15:
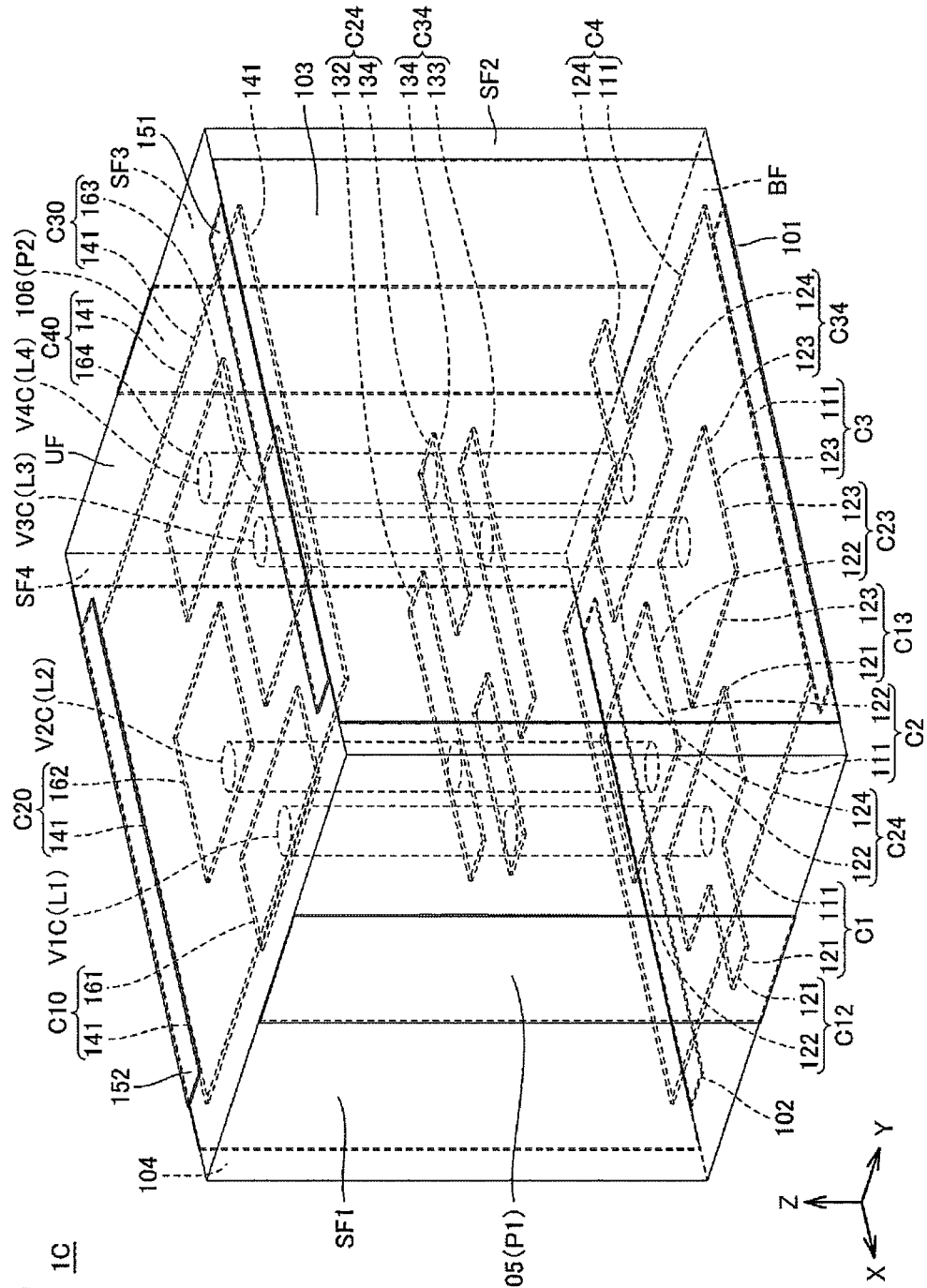
FIG. 15 is an outer perspective view of the band pass filter of FIG. 14.
Figure 16:
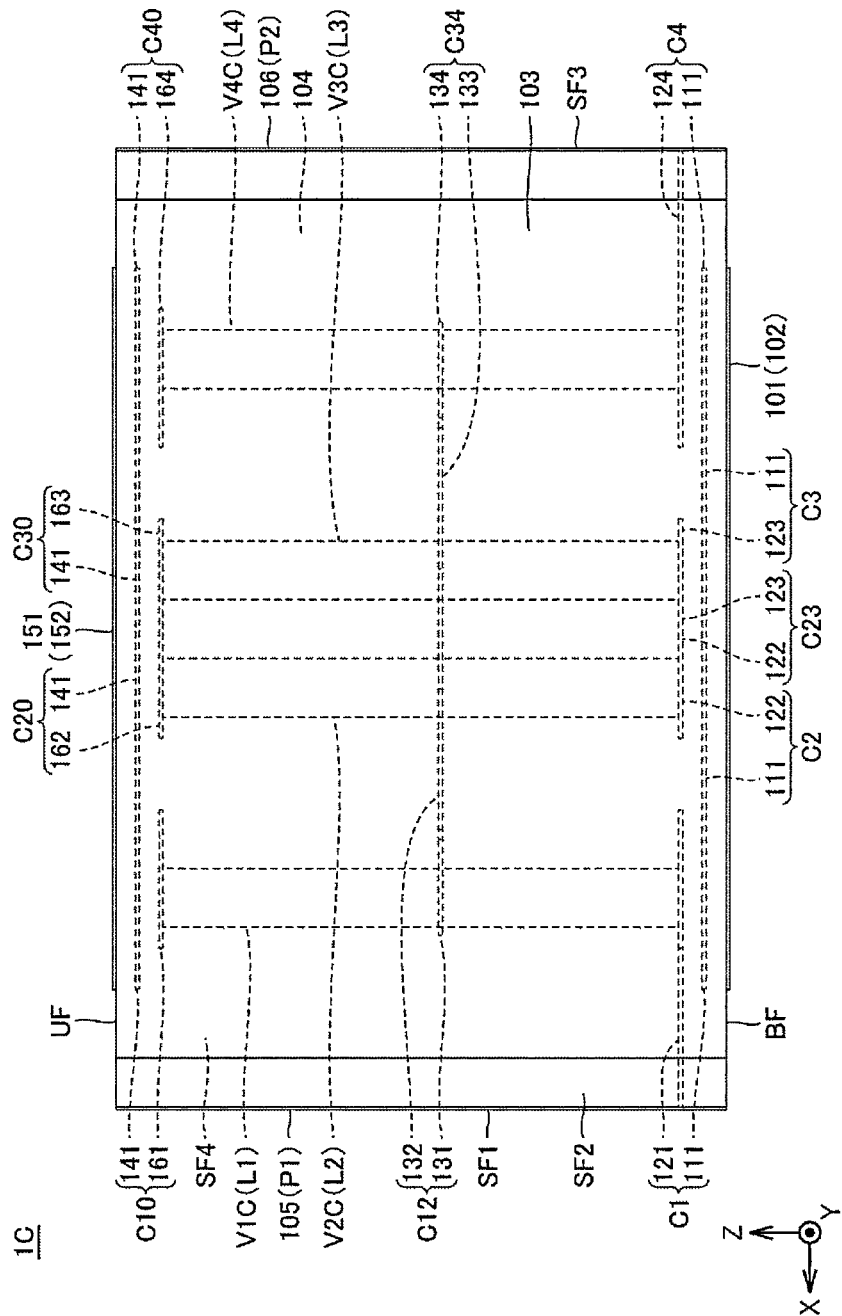
FIG. 16 is a plan view of a side surface of the band pass filter of FIG. 15 viewed from the Y-axis direction.

FIG. 15 is an outer perspective view of the band pass filter 1C of FIG. 14. FIG. 16 is a plan view of the side surface SF2 of the band pass filter 1C of FIG. 15 viewed from the Y-axis direction. A configuration of the band pass filter 1C is the same as or similar to the configuration of the band pass filter 1 of FIG. 1, except for that capacitor electrodes 161 to 164 and a ground electrode 141 are added and the via conductors V1 to V4 are replaced with V1C to V4C, respectively, and repeated description of the same or similar points is omitted.

As illustrated in FIGS. 15 and 16, the capacitor electrode 161 (fifth capacitor electrode) faces the ground electrode 141. The capacitor electrodes 161 and the ground electrode 141 define the capacitor C10.

The via conductor V1C (first via conductor) defines the inductor L1. One end of the via conductor V1C is connected to the capacitor electrode 121. The one end of the via conductor V1C is an open end that is galvanically isolated from the ground electrode 111 by the capacitor electrode 121. The other end of the via conductor V1C is connected to the capacitor electrode 161. The other end of the via conductor V1C is an open end that is galvanically isolated from the ground electrode 141 by the capacitor electrode 161. Since both ends of the via conductor V1C are open ends, the LC parallel resonator LC1 in FIG. 10 is a $\lambda/2$ resonator. A length of the via conductor V1C is equal or substantially equal to $\lambda/2$.

The capacitor electrode 162 (sixth capacitor electrode) faces the ground electrode 141. The capacitor electrode 162 and the ground electrode 141 define the capacitor C20.

The via conductor V2C (second via conductor) defines the inductor L2. One end of the via conductor V2C is connected to the capacitor electrode 122. The one end of the via conductor V2C is an open end that is galvanically isolated from the ground electrode 111 by the capacitor electrode 122. The other end of the via conductor V2C is connected to the capacitor electrode 162. The other end of the via conductor V2C is an open end that is galvanically isolated from the ground electrode 141 by the capacitor electrode 162. Since both ends of the via conductor V2C are open ends, the LC parallel resonator LC2 in FIG. 10 is a $\lambda/2$ resonator. A length of the via conductor V2C is almost equal to $\lambda/2$.

The capacitor electrode 163 (seventh capacitor electrode) faces the ground electrode 141. The capacitor electrode 163 and the ground electrode 141 define the capacitor C30.

The via conductor V3C (third via conductor) defines the inductor L3. One end of the via conductor V3C is connected to the capacitor electrode 123. One end of the via conductor V3C is an open end that is galvanically isolated from the ground electrode 111 by the capacitor electrode 123. The other end of the via conductor V3C is connected to the capacitor electrode 163. The other end of the via conductor V3C is an open end that is galvanically isolated from the ground electrode 141 by the capacitor electrode 163. Since both ends of the via conductor V3C are open ends, the LC parallel resonator LC3 in FIG. 10 is a $\lambda/2$ resonator. A length of the via conductor V3C is equal or substantially equal to $\lambda/2$.

The capacitor electrode 164 (eighth capacitor electrode) faces the ground electrode 141. The capacitor electrode 164 and the ground electrode 141 define the capacitor C40.

The via conductor V4C (fourth via conductor) defines the inductor L4. One end of the via conductor V4C is connected to the capacitor electrode 124. One end of the via conductor V4C is an open end that is galvanically isolated from the ground electrode 111 by the capacitor electrode 124. The other end of the via conductor V4C is connected to the capacitor electrode 164. The other end of the via conductor V4C is an open end that is galvanically isolated from the ground electrode 141 by the capacitor electrode 164. Since both ends of the via conductor V4C are open ends, the LC parallel resonator LC4 is a λ/2 resonator. A length of the via conductor V4C is equal or substantially equal to λ/2.

Modification 4 of Preferred Embodiment 1

In Preferred Embodiment 1, a configuration in which a plane electrode for adjusting capacitive coupling between LC resonators is connected between both ends of a via conductor that forms an inductor has been described. The LC filter according to the present preferred embodiment may be configured so as not to include the plane electrode.

Figure 17:
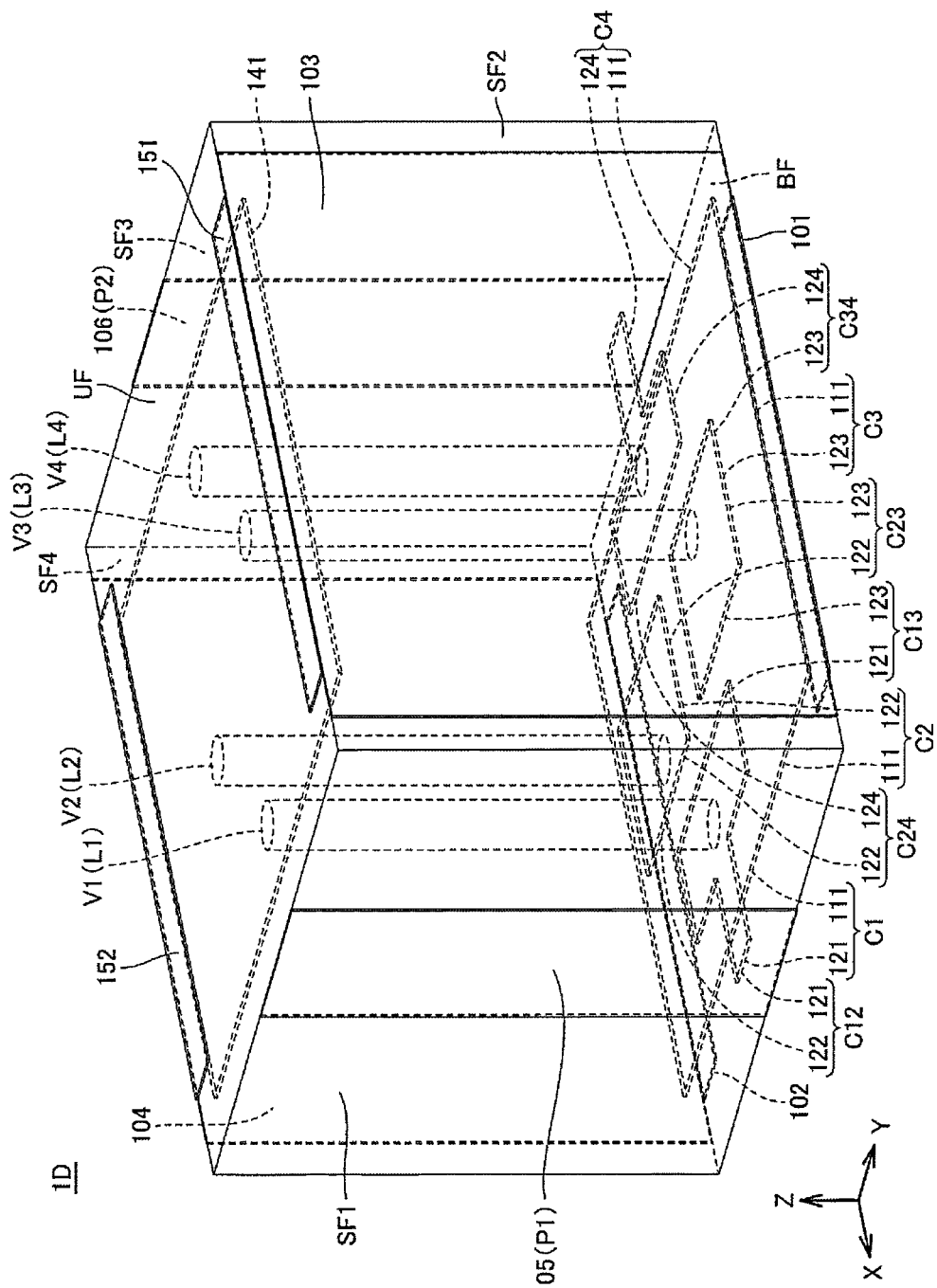
FIG. 17 is an outer perspective view of a band pass filter which is an example of an LC filter according to Modification 4 of Preferred Embodiment 1 of the present invention.

FIG. 17 is an outer perspective view of a band pass filter 1D, which is an example of an LC filter according to Modification 4 of Preferred Embodiment 1. A configuration of the band pass filter 1D is the same as or similar to the configuration of the band pass filter 1 of FIG. 1, except for that the plane electrodes 131 to 134 are excluded, and repeated description of the same or similar points is omitted.

As described above, according to the LC filters according to Preferred Embodiment 1 and Modifications 1 to 4, adjustment of bandpass characteristics of the LC filters can be easily made.

In Preferred Embodiment 1, a configuration in which a plurality of LC resonators are connected to a common ground electrode has been described. In Preferred Embodiment 2 of the present invention described below, a configuration in which a plurality of LC resonators are connected to different ground electrodes is described.

Preferred Embodiment 2

Figure 18:
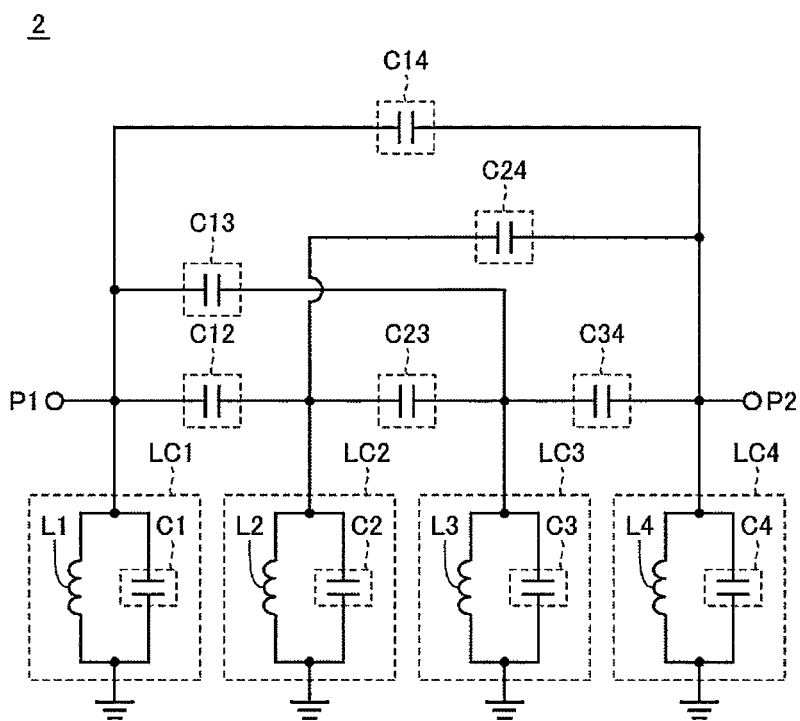
FIG. 18 is an equivalent circuit diagram of a band pass filter which is an example of an LC filter according to Preferred Embodiment 2 of the present invention.

FIG. 18 is an equivalent circuit diagram of a band pass filter 2, which is an example of an LC filter according to Preferred Embodiment 2 of the present invention. The equivalent circuit diagram illustrated in FIG. 18 is different from the equivalent circuit diagram illustrated in FIG. 1 in that a capacitor C14 is added.

As illustrated in FIG. 18, the capacitor C14 is connected between LC parallel resonators LC1 and LC4. The capacitor C14 represents capacitive coupling between the LC parallel resonators LC1 and LC4.

Figure 19:
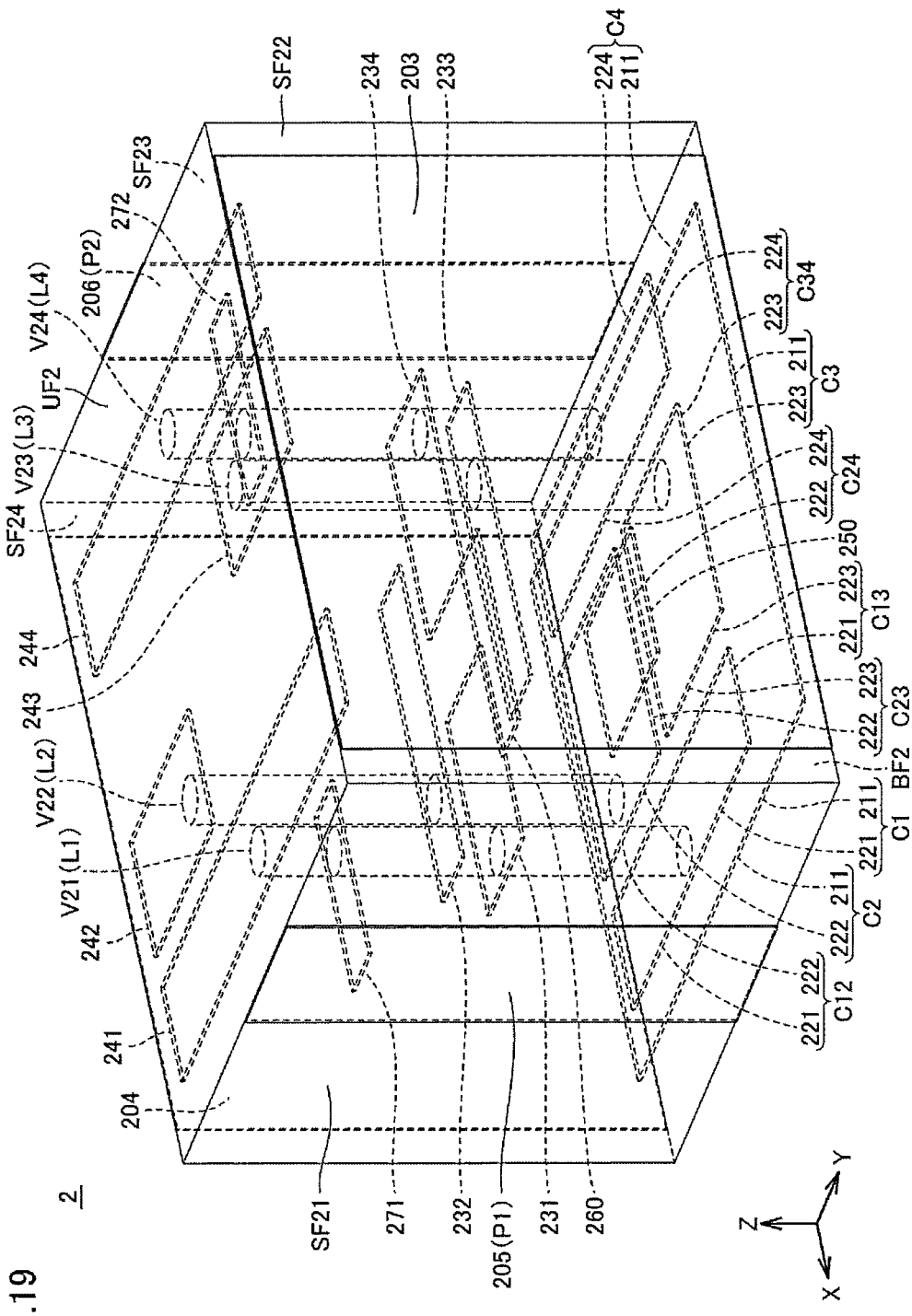
FIG. 19 is an outer perspective view of the band pass filter of FIG. 18.
Figure 20:
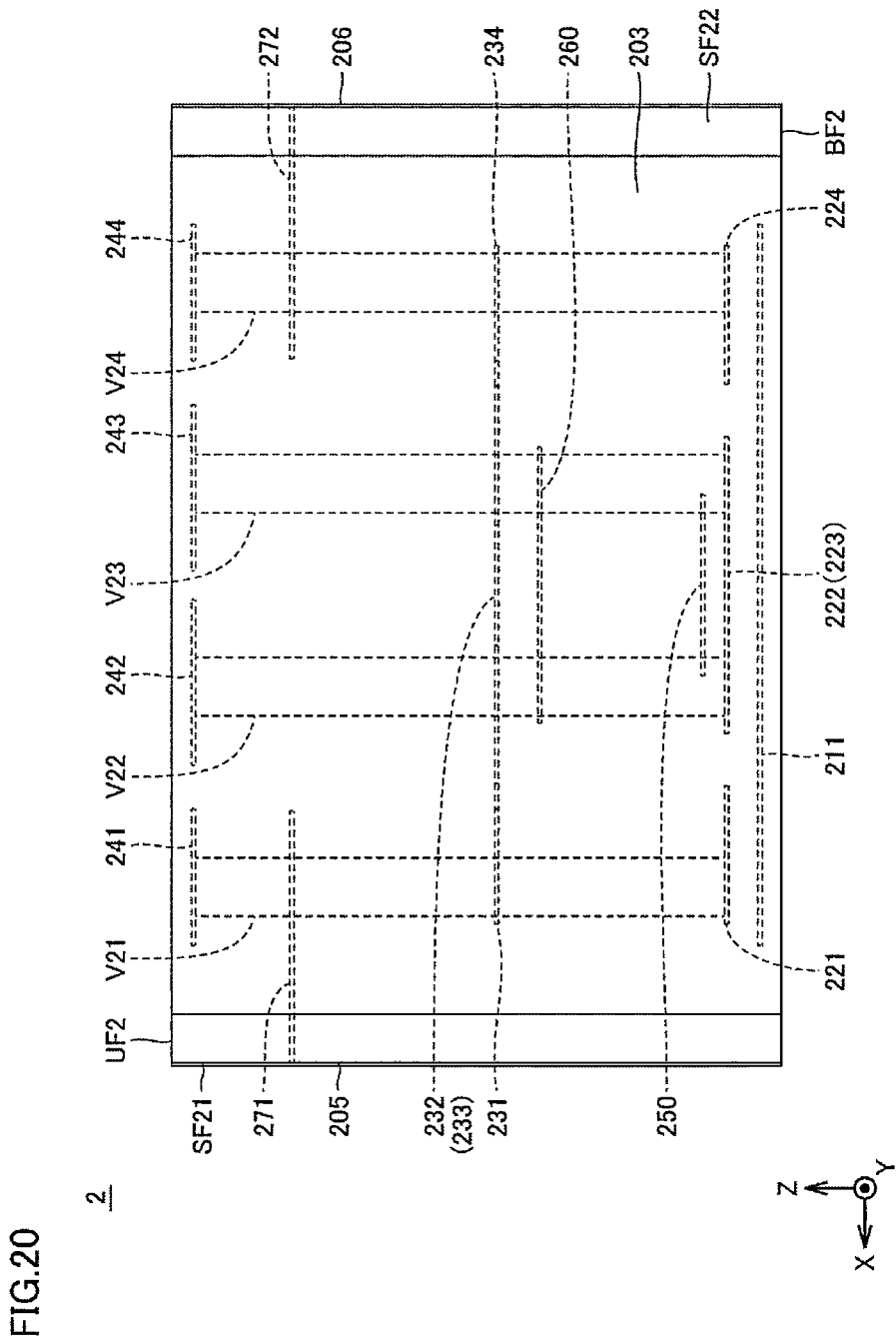
FIG. 20 is a plan view of a side surface of the band pass filter of FIG. 19 viewed from the Y-axis direction.

FIG. 19 is an outer appearance perspective view of the band pass filter 2 of FIG. 18. FIG. 20 is a plan view of a side surface SF22 of the band pass filter 2 of FIG. 19 viewed from the Y-axis direction. The equivalent circuit diagram of the band pass filter 2 is the same as or similar to the equivalent circuit diagram illustrated in FIG. 1.

The band pass filter 2 is a multilayer body in which a plurality of dielectric layers are laminated in the Z-axis direction (laminating direction) (see FIGS. 19 and 20). The band pass filter 2 has, for example, a rectangular or substantially rectangular parallelepiped shape. Surfaces of the band pass filter 2 that extend along a direction perpendicular or substantially perpendicular to the Z-axis direction are referred to as a bottom surface BF2 and an upper surface UF2. Surfaces that extend along the YZ plane among surfaces that extend along a direction parallel or substantially parallel with the laminating direction are referred to as side surfaces SF21 and SF23. Surfaces that extend along the ZX plane among surfaces that extend along the laminating direction are referred to as side surfaces SF22 and SF24.

A side surface electrode 205 is disposed on the side surface SF21. The side surface electrode 205 defines an input/output terminal P1. A side surface electrode 206 is disposed on the side surface SF23. The side surface electrode 206 defines an input/output terminal P2.

A side surface electrode 203 is disposed on the side surface SF22. A side surface electrode 204 is disposed on the side surface SF24. The side surface electrodes 203 and 204 correspond to ground points in FIG. 18.

In the band pass filter 2, a ground electrode 211 (first ground electrode) and ground electrodes 241 to 244 are disposed. The ground electrode 211 faces the bottom surface BF2. The ground electrodes 241 to 244 face the upper surface UF2. The ground electrode 241 is connected to the side surface electrodes 203 and 204. The ground electrode 242 is connected to the side surface electrode 204. The ground electrode 243 is connected to the side surface electrode 203. The ground electrode 244 is connected to the side surface electrodes 203 and 204. Between the ground electrode 211 and the ground electrodes 241 to 244, capacitor electrodes 221 to 224 and 250, via conductors V21 to V24, plane electrodes 231 to 234 and 260, and line electrode 271 and 272 are disposed.

The capacitor electrode 221 (first capacitor electrode) faces the ground electrode 211. The capacitor electrode 221 and the ground electrode 211 define a capacitor C1. The capacitor electrode 221 and the ground electrode 241 are connected by the via conductor V21 (first via conductor) that extends in the Z-axis direction.

The via conductor V21 defines an inductor L1. One end of the via conductor V21 is connected to the capacitor electrode 221. The one end of the via conductor V21 is an open end that is galvanically isolated from the ground electrode 211 by the capacitor electrode 221. The LC parallel resonator LC1 is a λ/4 resonator. A length of the via conductor V21 is equal or substantially equal to λ/4.

The capacitor electrode 222 (second capacitor electrode) faces the ground electrode 211. The capacitor electrode 222 and the ground electrode 211 define a capacitor C2. The capacitor electrode 222 and the ground electrode 242 are connected by the via conductor V22 (second via conductor) that extends in the Z-axis direction. The capacitor electrode 222 faces the capacitor electrode 221 in the X-axis direction. The capacitor electrodes 221 and 222 define a capacitor C12.

The via conductor V22 defines an inductor L2. One end of the via conductor V22 is connected to the capacitor electrode 222. The one end of the via conductor V22 is an open end that is galvanically isolated from the ground electrode 211 by the capacitor electrode 222. The LC parallel resonator LC2 is a λ/4 resonator. A length of the via conductor V22 is equal or substantially equal to λ/4.

The capacitor electrode 223 (third capacitor electrode) faces the ground electrode 211. The capacitor electrode 223 and the ground electrode 211 define a capacitor C3. The capacitor electrode 223 and the ground electrode 243 are connected by the via conductor V23 (third via conductor) that extends in the Z-axis direction. The capacitor electrode 223 faces the capacitor electrode 222 in the Y-axis direction. The capacitor electrodes 222 and 223 define a capacitor C23. The capacitor electrode 223 faces the capacitor electrode 221 in the X-axis direction. The capacitor electrodes 221 and 223 define a capacitor C13.

The via conductor V23 defines an inductor L3. One end of the via conductor V23 is connected to the capacitor electrode 223. The one end of the via conductor V23 is an open end that is galvanically isolated from the ground electrode 211 by the capacitor electrode 223. The LC parallel resonator LC3 is a λ/4 resonator. A length of the via conductor V23 is equal or substantially equal to λ/4.

The capacitor electrode 224 (fourth capacitor electrode) faces the ground electrode 211. The capacitor electrode 224 and the ground electrode 211 define a capacitor C4. The capacitor electrode 224 and the ground electrode 244 are connected by the via conductor V24 (fourth via conductor) that extends in the Z-axis direction. The capacitor electrode 224 faces the capacitor electrodes 222 and 223 in the X-axis direction. The capacitor electrodes 222 and 224 define a capacitor C24. The capacitor electrodes 223 and 224 define a capacitor C34.

The via conductor V24 defines an inductor L4. One end of the via conductor V24 is connected to the capacitor electrode 224. One end of the via conductor V24 is an open end that is galvanically isolated from the ground electrode 211 by the capacitor electrode 224. The LC parallel resonator LC4 is a λ/4 resonator. A length of the via conductor V24 is equal or substantially equal to λ/4.

The capacitor electrode 250 faces the capacitor electrodes 222 and 223 in the Z-axis direction. The capacitor electrodes 222, 223, and 250 define a capacitor C23.

The plane electrode 231 is connected to the via conductor V21 between both ends of the via conductor V21. The plane electrode 232 is connected to the via conductor V22 between both ends of the via conductor V22. The plane electrode 233 is connected to the via conductor V23 between both ends of the via conductor V23. The plane electrode 234 is connected to the via conductor V24 between both ends of the via conductor V24.

The plane electrode 232 faces the plane electrodes 231 and 234 in the Y-axis direction. The plane electrodes 231 and 232 define a capacitor C12. The plane electrodes 232 and 234 define a capacitor C24.

The plane electrode 233 faces the plane electrodes 231 and 234 in the Y-axis direction. The plane electrodes 231 and 233 define a capacitor C13. The plane electrodes 233 and 234 define a capacitor C34.

The plane electrode 260 faces the plane electrodes 231 and 234 in the Z-axis direction. The plane electrodes 231, 234, and 260 define the capacitor C14.

The line electrode 271 connects the side surface electrode 205 and the via conductor V21 between the plane electrode 231 and the ground electrode 241. The line electrode 272 connects the side surface electrode 206 and the via conductor V24 between the plane electrode 234 and the ground electrode 244.

Figure 21:
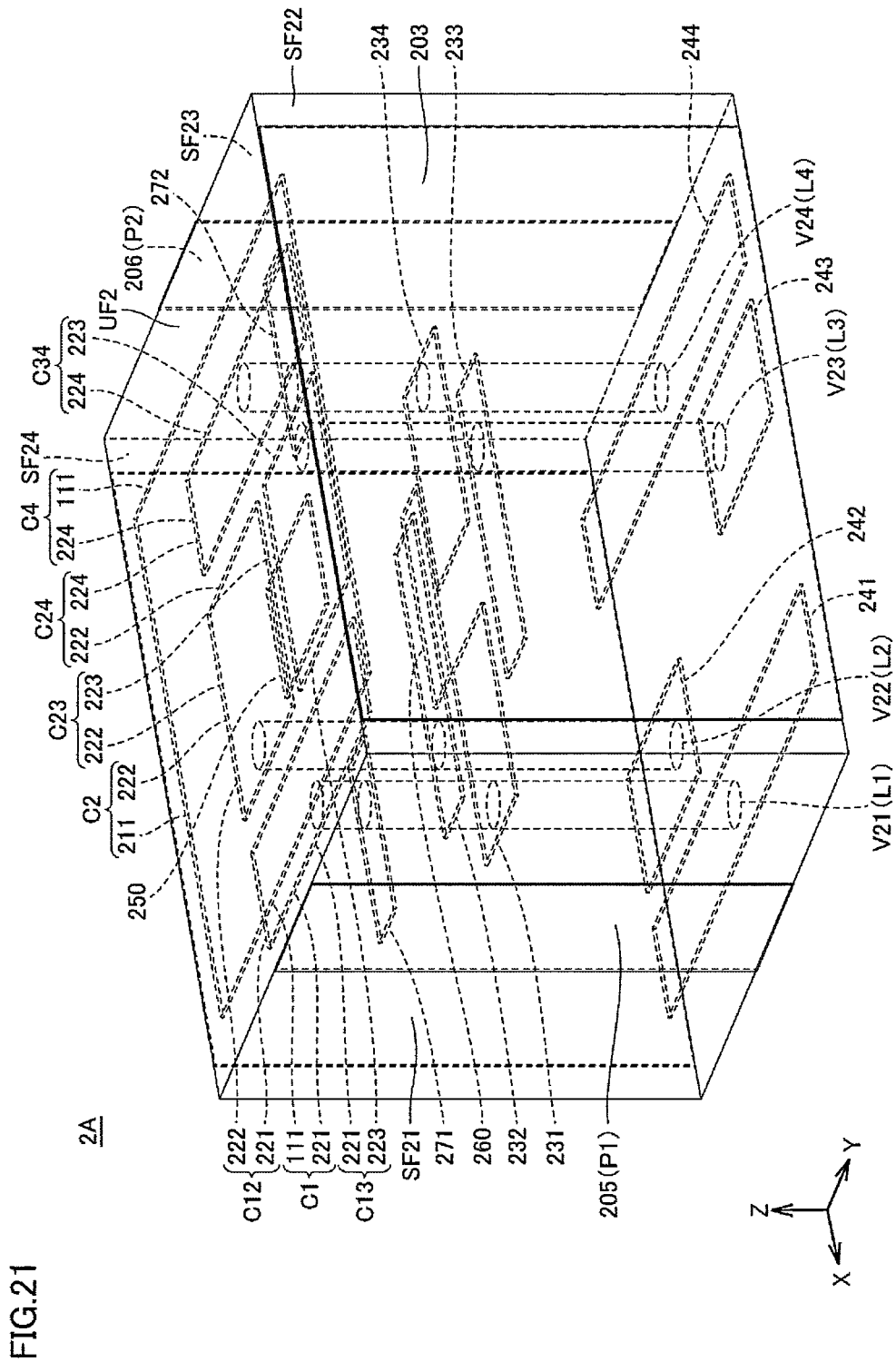
FIG. 21 is an outer perspective view of a band pass filter which is an example of an LC filter according to Modification of Preferred Embodiment 2 of the present invention.
Figure 22:
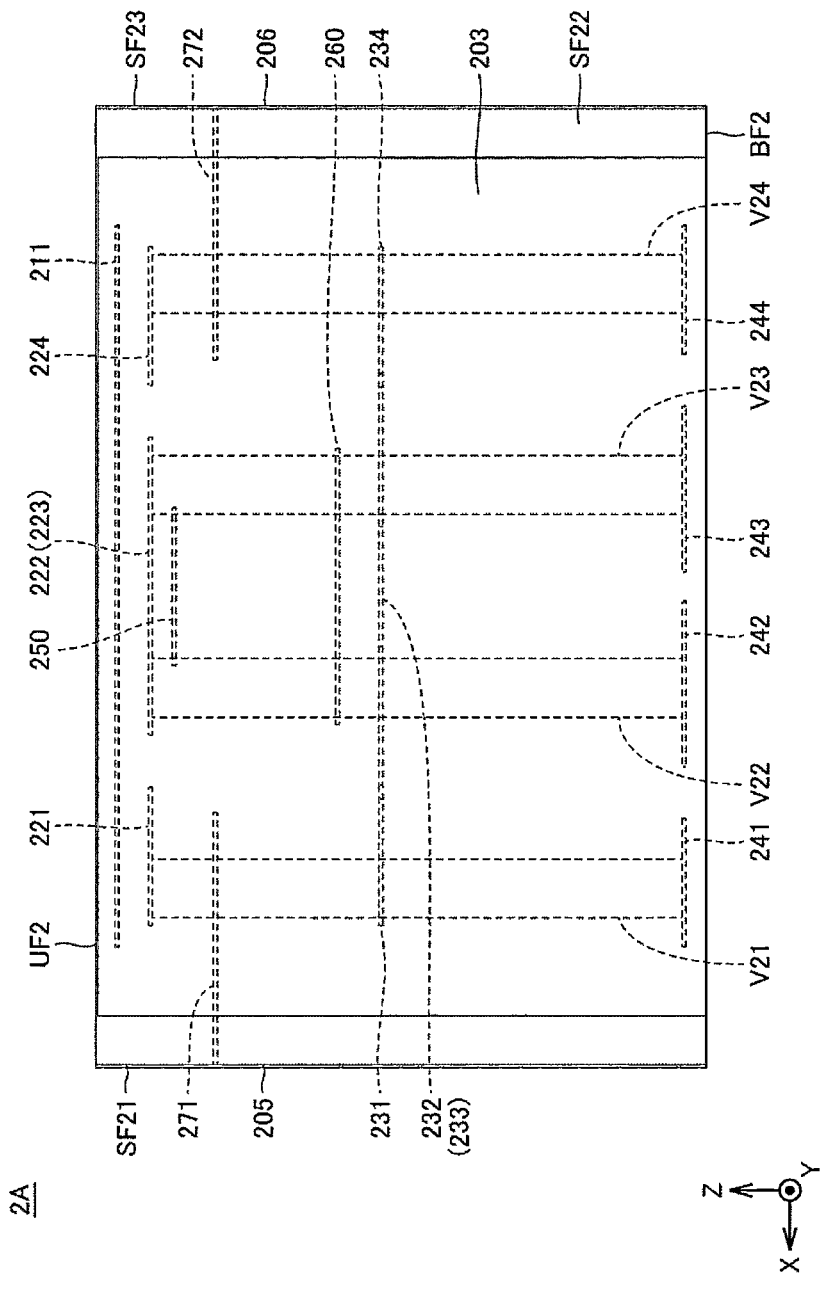
FIG. 22 is a plan view of a side surface of the band pass filter of FIG. 21 viewed from the Y-axis direction.

FIG. 21 is an outer perspective view of a band pass filter 2A, which is an example of an LC filter according to Modification of Preferred Embodiment 2. FIG. 22 is a plan view of the side surface SF22 of the band pass filter 2A of FIG. 21 viewed from the Y-axis direction. A configuration of the band pass filter 2A is the same as or similar to the configuration of the band pass filter 2 of FIG. 19, except for that among electrodes other than the line electrodes 271 and 272, electrodes close to the upper surface UF2 are disposed close to the bottom surface BF2 and electrodes close to the bottom surface BF2 are disposed close to the upper surface UF2. That is, the configuration of the band pass filter 2A is the same as or similar to the configuration of the band pass filter 2 of FIG. 19, except for that positions of electrodes other than the line electrodes 271 and 272 of the band pass filter 2 are inverted in an up-down direction (Z-axis direction). Repeated description of the same or similar points is omitted.

The line electrode 271 connects the side surface electrode 205 and the via conductor V21 between the plane electrode 231 and the capacitor electrode 221. The line electrode 272 connects the side surface electrode 206 and the via conductor V24 between the plane electrode 234 and the capacitor electrode 224.

Figure 23:
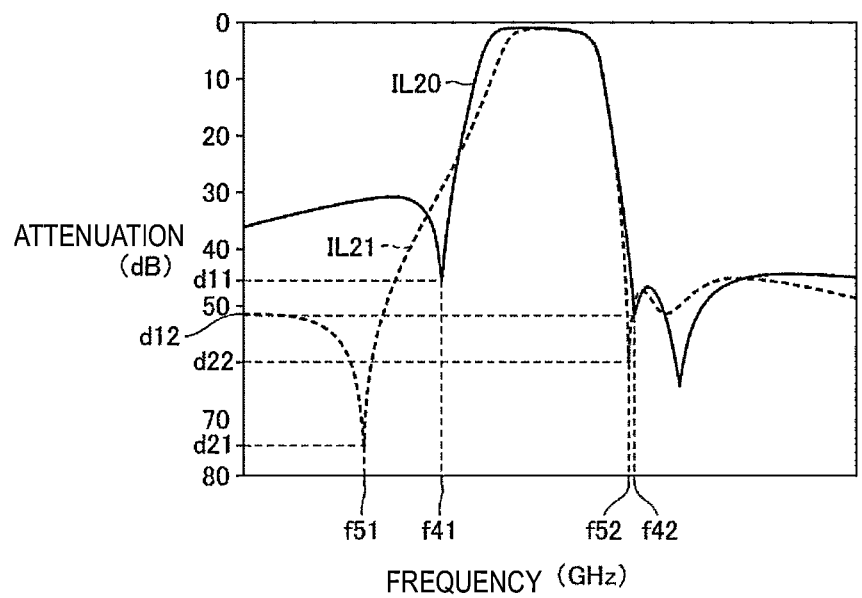
FIG. 23 illustrates bandpass characteristics of the band pass filter of FIG. 19 and bandpass characteristics of the band pass filter of FIG. 21.

FIG. 23 illustrates bandpass characteristics IL20 of the band pass filter 2 of FIG. 19 and bandpass characteristics IL21 of the band pass filter 2A of FIG. 21. As indicated by the bandpass characteristics IL20, an attenuation pole occurs at a frequency f41 on a low-frequency side of a pass band of the band pass filter 2 (see FIG. 23). An attenuation pole occurs at a frequency f42 on a high-frequency side of the pass band.

As indicated by the bandpass characteristics IL21, an attenuation pole occurs at a frequency f51 (<f41) on a low-frequency side of a pass band of the band pass filter 2A. An attenuation pole occurs at a frequency f52 (<f42) on a high-frequency side of the pass band.

A difference between the frequencies f41 and f51 is larger than a difference between the frequencies f42 and f52. An attenuation d21 at the frequency f51 of the bandpass characteristics IL21 is larger than an attenuation d11 at the frequency f41 of the bandpass characteristics IL20. An attenuation d22 at a frequency f52 of the bandpass characteristics IL21 is larger than an attenuation d12 at a frequency f42 of the bandpass characteristics IL20. A difference between the attenuations d21 and d11 is larger than a difference between the attenuations d22 and d12. By changing the configuration of the band pass filter 2 to the configuration of the band pass filter 2A, attenuation characteristics on the low-frequency side can be changed while almost maintaining attenuation characteristics on the high-frequency side.

As described above, according to the LC filters according to Preferred Embodiment 2 and Modifications thereof, adjustment of bandpass characteristics of the LC filters can be easily made.

In Preferred Embodiments 1 and 2, a case where the number of LC resonators included in an LC filter is 4 has been described. The number of LC resonators included in an LC filter according to a preferred embodiment is not limited to 4. The following describes a configuration in which an LC filter includes five LC resonators in Preferred Embodiments 3 and 4 and a configuration in which an LC filter includes seven LC resonators in Preferred Embodiment 5.

Preferred Embodiment 3

Figure 24:
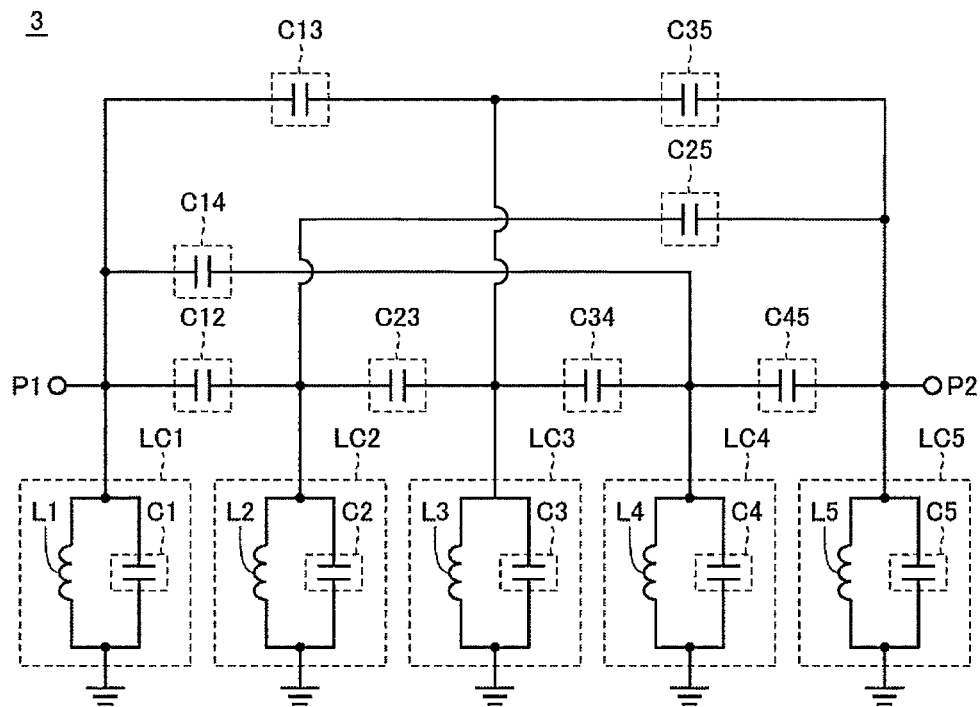
FIG. 24 is an equivalent circuit diagram of a band pass filter which is an example of an LC filter according to Preferred Embodiment 3 of the present invention.

FIG. 24 is an equivalent circuit diagram of a band pass filter 3, which is an example of an LC filter according to Preferred Embodiment 3 of the present invention. The equivalent circuit diagram illustrated in FIG. 24 is the same as or similar to the equivalent circuit diagram illustrated in FIG. 1, except that the capacitor C24 is deleted and an LC parallel resonator LC5 and capacitors C14, C25, C35, and C45 are added. That is, five LC resonators are sequentially coupled to define a five-stage LC filter. Repeated description of the same or similar points is omitted.

As illustrated in FIG. 24, the LC parallel resonator LC5 is connected to an input/output terminal P2.

The capacitor C14 is connected between LC parallel resonators LC1 and LC4. The capacitor C14 represents capacitive coupling between the LC parallel resonators LC1 and LC4.

The capacitor C25 is connected between LC parallel resonators LC2 and LC5. The capacitor C25 represents capacitive coupling between the LC parallel resonators LC2 and LC5.

The capacitor C35 is connected between LC parallel resonators LC3 and LC5. The capacitor C35 represents capacitive coupling between the LC parallel resonators LC3 and LC5.

The capacitor C45 is connected between the LC parallel resonators LC4 and LC5. The capacitor C45 represents capacitive coupling between the LC parallel resonators LC4 and LC5.

The LC parallel resonator LC5 includes an inductor L5 and a capacitor C5. The inductor L5 and the capacitor C5 are connected in parallel between a ground point and a connection point between the capacitor C45 and the input/output terminal P2.

Figure 25:
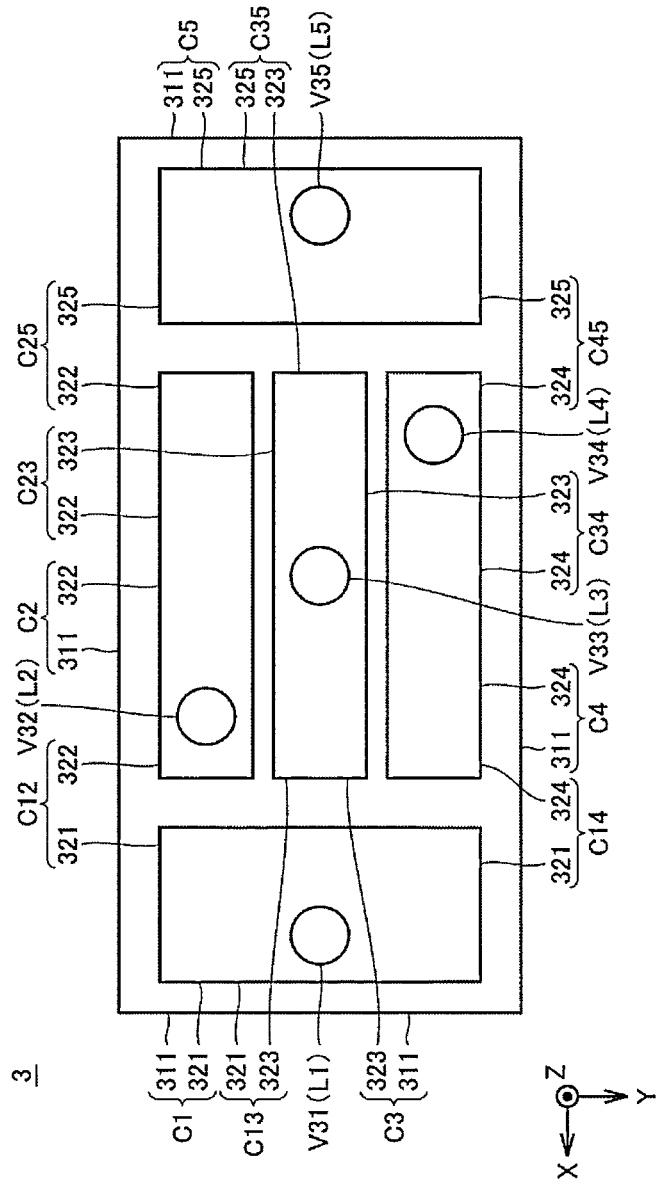
FIG. 25 is a plan view of the band pass filter of FIG. 24 viewed from the Z-axis direction.

FIG. 25 is a plan view of the band pass filter 3 of FIG. 24 viewed from the Z-axis direction. FIG. 25 illustrates main electrodes that constitute the LC parallel resonators LC1 to LC5 of FIG. 24 to emphasize features of the band pass filter 3. As illustrated in FIG. 25, the band pass filter 3 includes a ground electrode 311, via conductors V31 to V35, and capacitor electrodes 321 to 325.

The capacitor electrodes 321 to 325 face the ground electrode 311 in the Z-axis direction and define capacitors C1 to C5 together with the ground electrode 311, respectively. The capacitor electrodes 322 to 324 are disposed between the capacitor electrodes 321 and 325 in the X-axis direction. The capacitor electrode 323 is disposed between the capacitor electrodes 322 and 324 in the Y-axis direction.

The capacitor electrode 321 (first capacitor electrode) faces the capacitor electrode 322 (second capacitor electrode), the capacitor electrode 323 (third capacitor electrode), and the capacitor electrode 324 in the X-axis direction. The capacitor electrodes 321 and 322 define a capacitor C12. The capacitor electrodes 321 and 323 define a capacitor C13. The capacitor electrodes 321 and 324 define the capacitor C14.

The capacitor electrode 322 faces the capacitor electrode 323 in the Y-axis direction. The capacitor electrodes 322 and 323 define a capacitor C23. The capacitor electrode 323 faces the capacitor electrode 324 in the Y-axis direction. The capacitor electrodes 323 and 324 define a capacitor C34.

The capacitor electrode 325 (fourth capacitor electrode) faces the capacitor electrodes 322 to 324 in the X-axis direction. The capacitor electrodes 322 and 325 define the capacitor C25. The capacitor electrodes 323 and 325 define the capacitor C35. The capacitor electrodes 324 and 325 define the capacitor C45.

One end of the via conductor V31 (first via conductor) is connected to the capacitor electrode 321 (first capacitor electrode). The via conductor V31 defines an inductor L1.

One end of the via conductor V32 (second via conductor) is connected to the capacitor electrode 322 (second capacitor electrode). The via conductor V32 defines an inductor L2.

One end of the via conductor V33 (third via conductor) is connected to the capacitor electrode 323 (third capacitor electrode). The via conductor V33 defines an inductor L3.

One end of the via conductor V34 is connected to the capacitor electrode 324. The via conductor V34 defines an inductor L4.

One end of the via conductor V35 (fourth via conductor) is connected to the capacitor electrode 325 (fourth capacitor electrode). The via conductor V35 defines an inductor L5.

For example, in Preferred Embodiment 3, it is assumed that magnetic coupling is dominant over capacitive coupling. A distance between the via conductors V31 and V32 is shorter than a distance between the via conductors V31 and V33. Accordingly, magnetic coupling between the LC parallel resonators LC1 and LC2 is stronger than magnetic coupling between the LC parallel resonators LC1 and LC3.

A distance between the via conductors V34 and V35 is shorter than a distance between the via conductors V33 and V35. Accordingly, magnetic coupling between the LC parallel resonators LC4 and LC5 is stronger than magnetic coupling between the LC parallel resonators LC3 and LC5. As a result, the LC parallel resonators LC1, LC2, LC3, LC4, and LC5 are coupled in this order from the input/output terminal P1 side to define a five-stage LC filter.

As described above, according to the LC filter according to Preferred Embodiment 3, adjustment of bandpass characteristics of the LC filter can be easily made.

Preferred Embodiment 4

Figure 26:
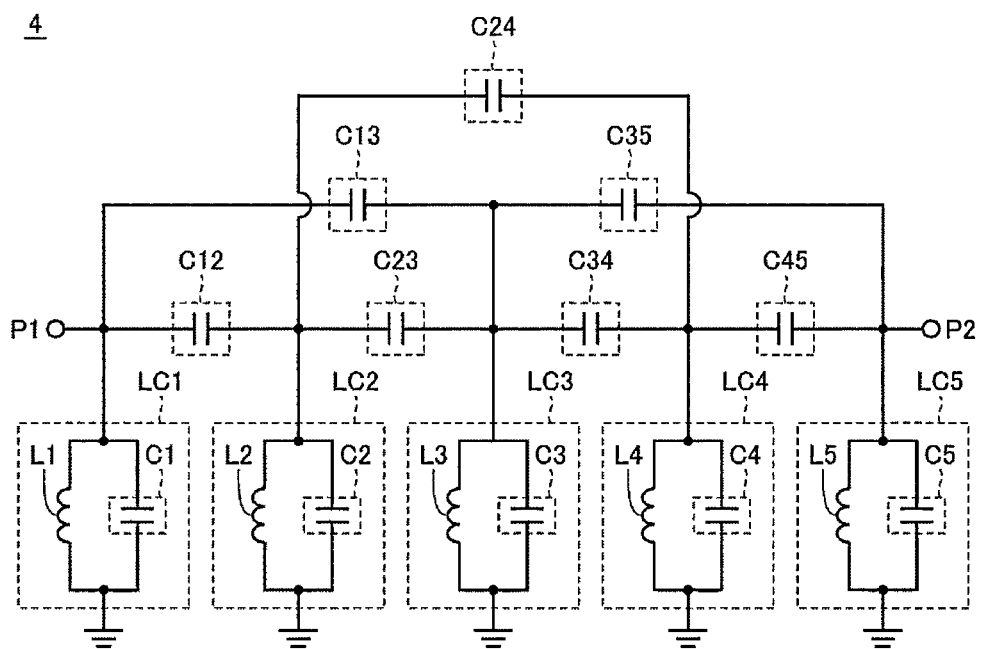
FIG. 26 is an equivalent circuit diagram of a band pass filter which is an example of an LC filter according to Preferred Embodiment 4 of the present invention.

FIG. 26 is an equivalent circuit diagram of a band pass filter 4, which is an example of an LC filter according to Preferred Embodiment 4 of the present invention. The equivalent circuit diagram illustrated in FIG. 26 is the same as or similar to the equivalent circuit diagram illustrated in FIG. 24, except that the capacitors C14 and C25 are deleted and a capacitor C24 is added. That is, five LC resonators are sequentially coupled to define a five-stage LC filter. Repeated description of the same or similar points is omitted.

As illustrated in FIG. 26, the capacitor C24 is connected between LC parallel resonators LC2 and LC4. The capacitor C24 represents capacitive coupling between the LC parallel resonators LC2 and LC4.

Figure 27:
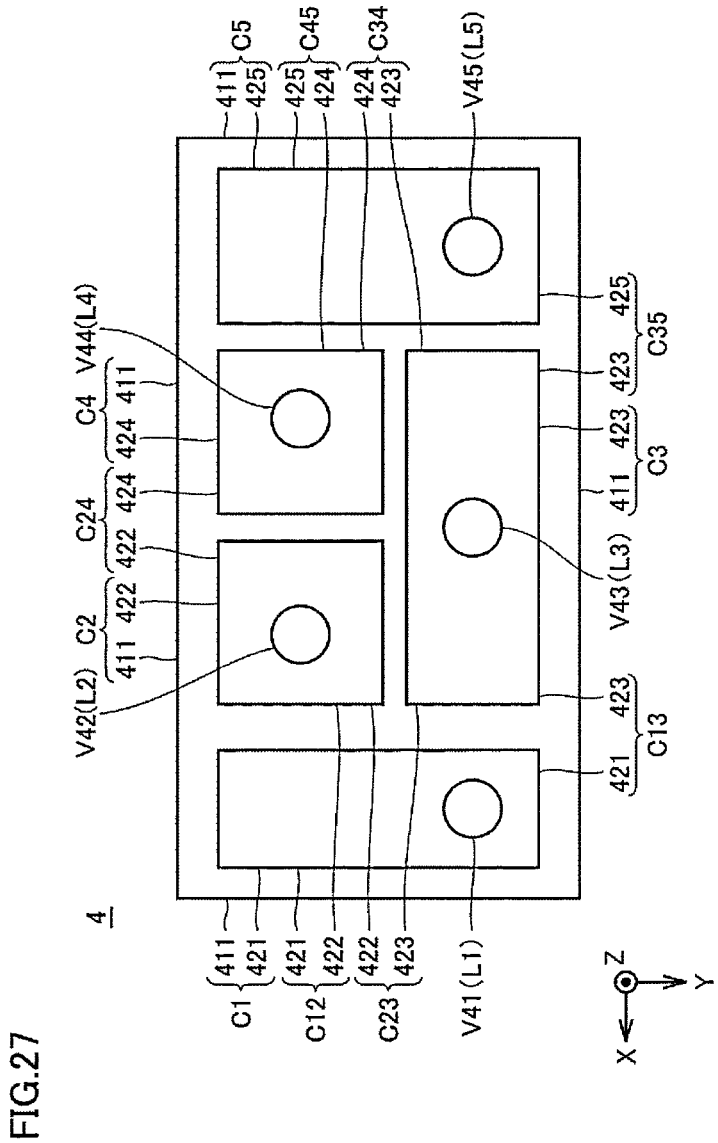
FIG. 27 is a plan view of the band pass filter of FIG. 26 viewed from the Z-axis direction.

FIG. 27 is a plan view of the band pass filter 4 of FIG. 26 viewed from the Z-axis direction. FIG. 27 illustrates main electrodes that define the LC parallel resonators LC1 to LC5 of FIG. 26 to emphasize features of the band pass filter 4. As illustrated in FIG. 27, the band pass filter 4 includes a ground electrode 411, via conductors V41 to V45, and capacitor electrodes 421 to 425.

The capacitor electrodes 421 to 425 face the ground electrode 411 in the Z-axis direction and define capacitors C1 to C5 together with the ground electrode 411, respectively. The capacitor electrodes 422 and 424 are disposed between the capacitor electrodes 421 and 425 in the X-axis direction. The capacitor electrode 423 is disposed between the capacitor electrodes 421 and 425 in the X-axis direction.

The capacitor electrode 421 (first capacitor electrode) faces the capacitor electrode 422 (second capacitor electrode) and the capacitor electrode 423 (third capacitor electrode) in the X-axis direction. The capacitor electrodes 421 and 422 define a capacitor C12. The capacitor electrodes 421 and 423 define a capacitor C13.

The capacitor electrode 422 faces the capacitor electrode 423 in the Y-axis direction. The capacitor electrodes 422 and 423 define a capacitor C23. The capacitor electrode 422 faces the capacitor electrode 424 (fourth capacitor electrode) in the X-axis direction. The capacitor electrodes 422 and 424 define the capacitor C24. The capacitor electrode 423 faces the capacitor electrode 424 in the Y-axis direction. The capacitor electrodes 423 and 424 define a capacitor C34.

The capacitor electrode 425 faces the capacitor electrodes 423 and 424 in the X-axis direction. The capacitor electrodes 423 and 425 define a capacitor C35. The capacitor electrodes 424 and 425 define a capacitor C45.

One end of the via conductor V41 (first via conductor) is connected to the capacitor electrode 421 (first capacitor electrode). The via conductor V41 defines an inductor L1.

One end of the via conductor V42 (second via conductor) is connected to the capacitor electrode 422 (second capacitor electrode). The via conductor V42 defines an inductor L2.

One end of the via conductor V43 (third via conductor) is connected to the capacitor electrode 423 (third capacitor electrode). The via conductor V43 defines an inductor L3.

One end of the via conductor V44 (fourth via conductor) is connected to the capacitor electrode 424. The via conductor V44 defines an inductor L4.

One end of the via conductor V45 is connected to the capacitor electrode 425. The via conductor V45 forms an inductor L5.

For example, in Preferred Embodiment 4, it is assumed that magnetic coupling is dominant over capacitive coupling. A distance between the via conductors V41 and V42 is shorter than a distance between the via conductors V41 and V43. Accordingly, magnetic coupling between the LC parallel resonators LC1 and LC2 is stronger than magnetic coupling between the LC parallel resonators LC1 and LC3.

A distance between the via conductors V44 and V45 is shorter than a distance between the via conductors V43 and V45. Accordingly, magnetic coupling between the LC parallel resonators LC4 and LC5 is stronger than magnetic coupling between the LC parallel resonators LC3 and LC5. As a result, the LC parallel resonators LC1, LC2, LC3, LC4, and LC5 are coupled in this order from an input/output terminal P1 side to constitute a five-stage LC filter.

As described above, according to the LC filter according to Preferred Embodiment 4, adjustment of bandpass characteristics of the LC filter can be easily made.

Preferred Embodiment 5

Figure 28:
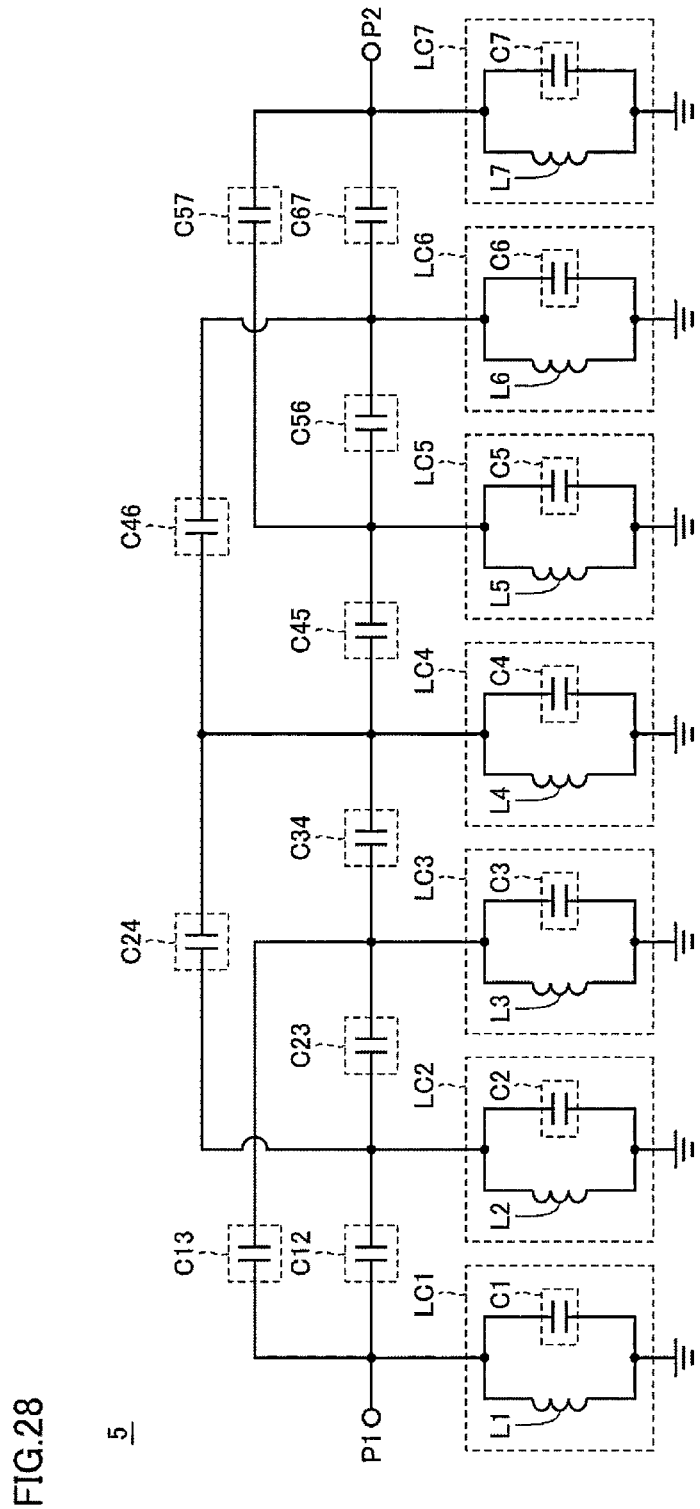
FIG. 28 is an equivalent circuit diagram of a band pass filter which is an example of an LC filter according to Preferred Embodiment 5 of the present invention.

FIG. 28 is an equivalent circuit diagram of a band pass filter 5, which is an example of an LC filter according to Preferred Embodiment 5 of the present invention. The equivalent circuit diagram illustrated in FIG. 28 is the same as or similar to the equivalent circuit diagram illustrated in FIG. 1, except that LC parallel resonators LC5 to LC7 and capacitors C45, C46, C56, C57, and C67 are added. That is, seven LC resonators are sequentially coupled to define a seven-stage LC filter. Repeated description of the same or similar points is omitted.

As illustrated in FIG. 28, the LC parallel resonators LC5 and LC6 are disposed between LC parallel resonators LC4 and LC7.

The capacitor C45 is connected between the LC parallel resonators LC4 and LC5. The capacitor C45 represents capacitive coupling between the LC parallel resonators LC4 and LC5.

The capacitor C46 is connected between the LC parallel resonators LC4 and LC6. The capacitor C46 represents capacitive coupling between the LC parallel resonators LC4 and LC6.

The capacitor C56 is connected between the LC parallel resonators LC5 and LC6. The capacitor C56 represents capacitive coupling between the LC parallel resonators LC5 and LC6.

The capacitor C57 is connected between the LC parallel resonators LC5 and LC7. The capacitor C57 represents capacitive coupling between the LC parallel resonators LC5 and LC7.

The capacitor C67 is connected between the LC parallel resonators LC6 and LC7. The capacitor C67 represents capacitive coupling between the LC parallel resonators LC6 and LC7.

The LC parallel resonator LC5 includes an inductor L5 and a capacitor C5. The inductor L5 and the capacitor C5 are connected in parallel between a ground point and a connection point between the capacitors C45 and C56.

The LC parallel resonator LC6 includes an inductor L6 and a capacitor C6. The inductor L6 and the capacitor C6 are connected in parallel between a ground point and a connection point between the capacitors C56 and C67.

The LC parallel resonator LC7 includes an inductor L7 and a capacitor C7. The inductor L7 and the capacitor C7 are connected in parallel between a ground point and a connection point between the capacitor C67 and an input/output terminal P2.

Figure 29:
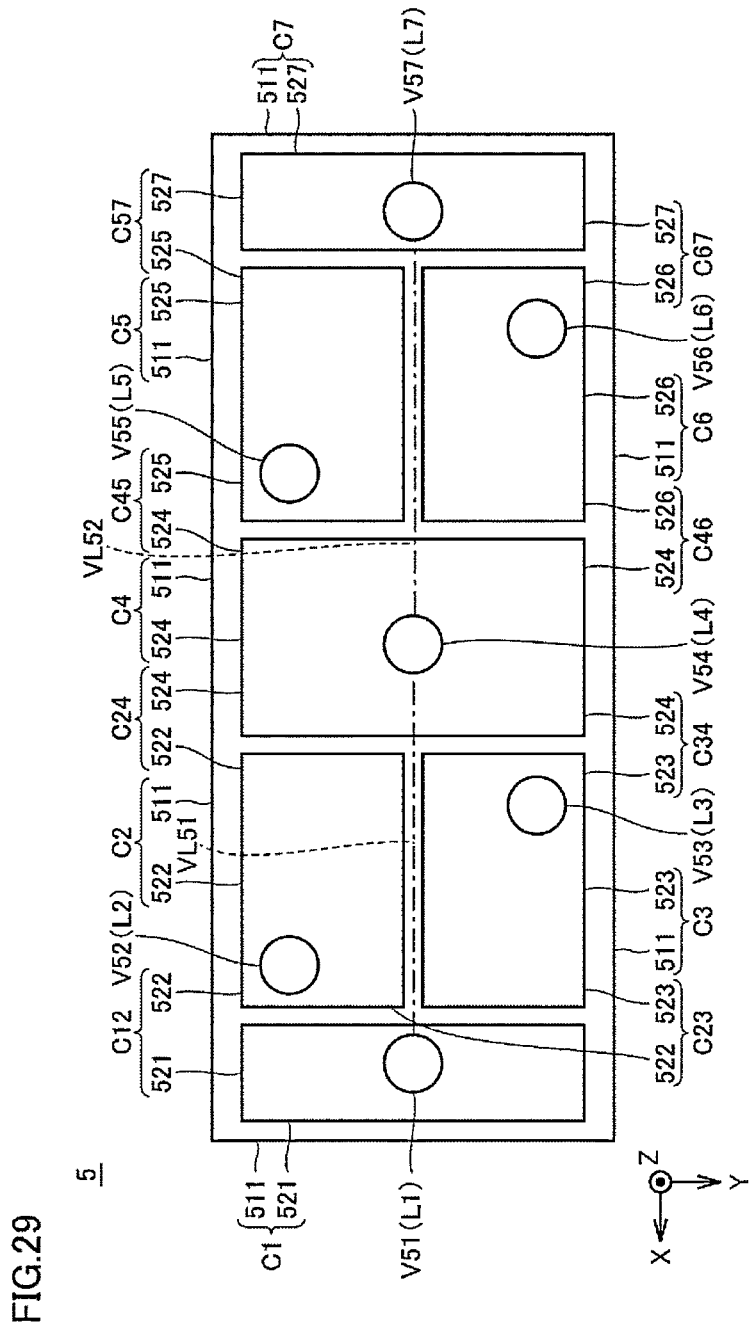
FIG. 29 is a plan view of the band pass filter of FIG. 28 viewed from the Z-axis direction.

FIG. 29 is a plan view of the band pass filter 5 of FIG. 28 viewed from the Z-axis direction. FIG. 29 illustrates main electrodes that define the LC parallel resonators LC1 to LC7 of FIG. 28 to emphasize features of the band pass filter 5. As illustrated in FIG. 29, the band pass filter 5 includes a ground electrode 511 (first ground electrode), via conductors V51 to V57, and capacitor electrodes 521 to 527.

The capacitor electrodes 521 to 527 face the ground electrode 511 in the Z-axis direction and define capacitors C1 to C7 together with the ground electrode 511, respectively. The capacitor electrodes 522 and 523 are disposed between the capacitor electrodes 521 and 524 in the X-axis direction. The capacitor electrodes 522 and 523 are disposed side by side in the Y-axis direction. The capacitor electrodes 525 and 526 are disposed between the capacitor electrodes 524 and 527 in the X-axis direction. The capacitor electrodes 525 and 526 are disposed side by side in the Y-axis direction.

The capacitor electrode 521 (first capacitor electrode) faces the capacitor electrode 522 (second capacitor electrode) and the capacitor electrode 523 (third capacitor electrode) in the X-axis direction. The capacitor electrodes 521 and 522 define a capacitor C12. The capacitor electrodes 521 and 523 define a capacitor C13. The capacitor electrode 523 faces the capacitor electrode 522 in the Y-axis direction. The capacitor electrodes 522 and 523 define a capacitor C23. The capacitor electrode 524 (fourth capacitor electrode) faces the capacitor electrodes 522 and 523 in the X-axis direction. The capacitor electrodes 522 and 524 define a capacitor C24. The capacitor electrodes 523 and 524 define a capacitor C34.

The capacitor electrode 524 faces the capacitor electrodes 525 and 526 in the X-axis direction. The capacitor electrodes 524 and 525 define the capacitor C45. The capacitor electrodes 524 and 526 define the capacitor C46. The capacitor electrode 525 faces the capacitor electrode 526 in the Y-axis direction. The capacitor electrodes 525 and 526 define the capacitor C56. The capacitor electrode 527 faces the capacitor electrodes 525 and 526 in the X-axis direction. The capacitor electrodes 525 and 527 define the capacitor C57. The capacitor electrodes 526 and 527 define the capacitor C67.

One end of the via conductor V51 (first via conductor) is connected to the capacitor electrode 521 (first capacitor electrode). The via conductor V51 defines an inductor L1.

One end of the via conductor V52 (second via conductor) is connected to the capacitor electrode 522 (second capacitor electrode). The via conductor V52 defines an inductor L2.

One end of the via conductor V53 (third via conductor) is connected to the capacitor electrode 523 (third capacitor electrode). The via conductor V53 defines an inductor L3.

One end of the via conductor V54 (fourth via conductor) is connected to the capacitor electrode 524 (fourth capacitor electrode). The via conductor V54 defines an inductor L4.

One end of the via conductor V55 is connected to the capacitor electrode 525. The via conductor V55 defines an inductor L5.

One end of the via conductor V56 is connected to the capacitor electrode 526. The via conductor V56 defines an inductor L6.

One end of the via conductor V57 is connected to the capacitor electrode 527. The via conductor V57 defines an inductor L7.

The via conductors V52 and V53 are disposed on both sides of a virtual line VL51 connecting the via conductors V51 and V54, respectively. The via conductors V55 and V56 are disposed on both sides of a virtual line VL52 connecting the via conductors V54 and V57, respectively.

For example, in Preferred Embodiment 5, it is assumed that magnetic coupling is dominant over capacitive coupling. A distance between the via conductors V51 and V52 is shorter than a distance between the via conductors V51 and V53. Accordingly, magnetic coupling between the LC parallel resonators LC1 and LC2 is stronger than magnetic coupling between the LC parallel resonators LC1 and LC3.

A distance between the via conductors V54 and V53 is shorter than a distance between the via conductors V54 and V52. Accordingly, magnetic coupling between the LC parallel resonators LC4 and LC3 is stronger than magnetic coupling between the LC parallel resonators LC4 and LC2.

A distance between the via conductors V54 and V55 is shorter than a distance between the via conductors V54 and V56. Accordingly, magnetic coupling between the LC parallel resonators LC4 and LC5 is stronger than magnetic coupling between the LC parallel resonators LC4 and LC6.

A distance between the via conductors V57 and V56 is shorter than a distance between the via conductors V57 and V55. Accordingly, magnetic coupling between the LC parallel resonators LC7 and LC6 is stronger than magnetic coupling between the LC parallel resonators LC7 and LC5. As a result, the LC parallel resonators LC1, LC2, LC3, LC4, LC5, LC6, and LC7 are coupled in this order from the input/output terminal P1 side to constitute a seven-stage LC filter.

As described above, according to the LC filter according to Preferred Embodiment 5, adjustment of bandpass characteristics of the LC filter can be easily made.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LC filter comprising:
    a plurality of dielectric layers laminated in a laminating direction;
    a first LC resonator;
    a second LC resonator;
    a third LC resonator;
    a fourth LC resonator; and
    a first ground electrode; wherein
    the first LC resonator includes a first via conductor extending in the laminating direction and a first capacitor electrode connected to one end of the first via conductor and facing the first ground electrode in the laminating direction;
    the second LC resonator includes a second via conductor extending in the laminating direction and a second capacitor electrode connected to one end of the second via conductor and facing the first ground electrode in the laminating direction;
    the third LC resonator includes a third via conductor extending in the laminating direction and a third capacitor electrode connected to one end of the third via conductor and facing the first ground electrode in the laminating direction;
    the fourth LC resonator includes a fourth via conductor extending in the laminating direction and a fourth capacitor electrode connected to one end of the fourth via conductor and facing the first ground electrode in the laminating direction;
    the second capacitor electrode faces each of the first capacitor electrode, the third capacitor electrode, and the fourth capacitor electrode in a direction orthogonal or substantially orthogonal to the laminating direction; and
    the first capacitor electrode, the second capacitor electrode, the third capacitor electrode, and the fourth capacitor electrode face each other in at least two directions that are orthogonal or substantially orthogonal to one another.

2. The LC filter according to claim 1, wherein the third capacitor electrode faces each of the first capacitor electrode, the second capacitor electrode, and the fourth capacitor electrode in the direction orthogonal or substantially orthogonal to the laminating direction.

3. The LC filter according to claim 1, wherein
    the second capacitor electrode includes a first outer peripheral portion, a second outer peripheral portion, and a third outer peripheral portion that face the first capacitor electrode, the third capacitor electrode, and the fourth capacitor electrode, respectively in the direction orthogonal or substantially orthogonal to the laminating direction;
    the first capacitor electrode includes a fourth outer peripheral portion facing the first outer peripheral portion;
    the third capacitor electrode includes a fifth outer peripheral portion facing the second outer peripheral portion;
    the fourth capacitor electrode includes a sixth outer peripheral portion facing the third outer peripheral portion; and
    the first outer peripheral portion, the second outer peripheral portion, and the third outer peripheral portion are parallel or substantially parallel with the fourth outer peripheral portion, the fifth outer peripheral portion, and the sixth outer peripheral portion, respectively.

4. The LC filter according to claim 1, wherein the plurality of dielectric layers include a dielectric layer in which the first capacitor electrode, the second capacitor electrode, the third capacitor electrode, and the fourth capacitor electrode are provided.

5. The LC filter according to claim 4, further comprising:
    a second ground electrode; wherein
    the first LC resonator further includes a fifth capacitor electrode connected to the another end of the first via conductor and facing the second ground electrode in the laminating direction;
    the second LC resonator further includes a sixth capacitor electrode connected to the another end of the second via conductor and facing the second ground electrode in the laminating direction;
    the third LC resonator further includes a seventh capacitor electrode connected to the another end of the third via conductor and facing the second ground electrode in the laminating direction; and the fourth LC resonator further includes an eighth capacitor electrode connected to the another end of the fourth via conductor and facing the second ground electrode in the laminating direction.

6. The LC filter according to claim 4, further comprising a second ground electrode to which another end of the first via conductor, another end of the second via conductor, another end of the third via conductor, and another end of the fourth via conductor are connected.

7. The LC filter according to claim 1, wherein the second via conductor and the third via conductor are provided on both two sides of a virtual line connecting the first via conductor and the fourth via conductor, respectively in plan view viewed from the laminating direction.

8. The LC filter according to claim 1, wherein the first LC resonator is connected to an input/output terminal.

9. The LC filter according to claim 8, wherein an inductor or a capacitor is interposed between the first LC resonator and the input/output terminal.

10. The LC filter according to claim 1, wherein the second and third LC resonators are between the first and fourth LC resonators.

11. The LC filter according to claim 1, wherein the LC filter has a rectangular or substantially rectangular parallelepiped shape; and a side surface electrode is provided on a side surface of the LC filter.

12. The LC filter according to claim 11, wherein the side surface electrode defines an input/output terminal.

13. The LC filter according to claim 11, wherein the first capacitor electrode is connected to the side surface electrode.

14. The LC filter according to claim 1, wherein the first via conductor defines a first inductor.

15. The LC filter according to claim 1, wherein the second via conductor defines a second inductor.

16. The LC filter according to claim 1, wherein the third via conductor defines a third inductor.

17. The LC filter according to claim 1, wherein the fourth via conductor defines a fourth inductor.

* * * * *